(12) United States Patent
Brabant et al.

(10) Patent No.: US 8,530,340 B2
(45) Date of Patent: Sep. 10, 2013

(54) EPITAXIAL SEMICONDUCTOR DEPOSITION METHODS AND STRUCTURES

(75) Inventors: Paul D. Brabant, Phoenix, AZ (US);
Joseph P. Italiano, Phoenix, AZ (US);
Chantal J. Arena, Mesa, AZ (US);
Pierre Tomasini, Phoenix, AZ (US); Ivo Raaijmakers, Bilthoven (NL); Matthias Bauer, Riederich (DE)

(73) Assignee: ASM America, Inc., Phoenix, AZ (US)

( * ) Notice: Subject to any disclaimer, the term of this patent is extended or adjusted under 35 U.S.C. 154(b) by 671 days.

(21) Appl. No.: 12/556,377

(22) Filed: Sep. 9, 2009

(65) Prior Publication Data
US 2010/0006024 A1    Jan. 14, 2010

Related U.S. Application Data

(63) Continuation of application No. 11/755,528, filed on May 30, 2007, now Pat. No. 7,682,947, which is a continuation of application No. 10/800,390, filed on Mar. 12, 2004, now Pat. No. 7,238,595.

(60) Provisional application No. 60/455,226, filed on Mar. 13, 2003, provisional application No. 60/470,584, filed on May 14, 2003, provisional application No. 60/545,442, filed on Feb. 17, 2004.

(51) Int. Cl.
*H01L 21/20*    (2006.01)

(52) U.S. Cl.
USPC ....... 438/481; 257/E21.102; 117/84; 118/715

(58) Field of Classification Search
USPC .......... 257/190, E21.115, E21.102; 438/481; 117/84, 88; 118/715
See application file for complete search history.

(56) References Cited

U.S. PATENT DOCUMENTS

| | | | |
|---|---|---|---|
| 5,221,413 A | 6/1993 | Brasen et al. |
| 5,221,556 A | 6/1993 | Hawkins et al. |
| 5,256,550 A | 10/1993 | Laderman et al. |
| 5,259,918 A | 11/1993 | Akbar et al. |
| 5,442,205 A | 8/1995 | Brasen et al. |
| 5,879,970 A | 3/1999 | Shiota et al. |
| 5,891,769 A | 4/1999 | Liaw et al. |
| 6,030,894 A | 2/2000 | Hada et al. |

(Continued)

FOREIGN PATENT DOCUMENTS

| | | |
|---|---|---|
| EP | 0 858 101 | 8/1998 |
| JP | 04-245419 | 9/1992 |

(Continued)

OTHER PUBLICATIONS

Bauer et al., "High Ge Content Photodetectors on Thin SiGe Buffers", *Materials Science and Engineering* B89:77-83 (2002).

(Continued)

*Primary Examiner* — David Vu
(74) *Attorney, Agent, or Firm* — Knobbe, Martens, Olson & Bear LLP

(57) ABSTRACT

Methods for depositing epitaxial films such as epitaxial Ge and SiGe films. During cooling from high temperature processing to lower deposition temperatures for Ge-containing layers, Si or Ge compounds are provided to the substrate. Smooth, thin, relatively defect-free Ge or SiGe layers result. Retrograded relaxed SiGe is also provided between a relaxed, high Ge-content seed layer and an overlying strained layer.

15 Claims, 14 Drawing Sheets

(56) References Cited

U.S. PATENT DOCUMENTS

| | | | |
|---|---|---|---|
| 6,093,252 A | 7/2000 | Wengert et al. | |
| 6,107,653 A | 8/2000 | Fitzgerald | |
| 6,319,782 B1 | 11/2001 | Nakabayashi | |
| 6,373,112 B1 | 4/2002 | Murthy et al. | |
| 6,429,098 B1 | 8/2002 | Bensahel et al. | |
| 6,455,871 B1 | 9/2002 | Shim et al. | |
| 6,537,370 B1 | 3/2003 | Hernandez et al. | |
| 6,555,839 B2 * | 4/2003 | Fitzgerald | 257/18 |
| 6,562,736 B2 | 5/2003 | Yanagawa et al. | |
| 6,573,126 B2 | 6/2003 | Cheng et al. | |
| 6,592,942 B1 | 7/2003 | Van Wijck | |
| 6,633,066 B1 | 10/2003 | Bae et al. | |
| 6,635,110 B1 | 10/2003 | Luan et al. | |
| 6,645,836 B2 | 11/2003 | Kanzawa et al. | |
| 6,713,326 B2 | 3/2004 | Cheng et al. | |
| 6,723,622 B2 | 4/2004 | Murthy et al. | |
| 6,770,134 B2 * | 8/2004 | Maydan et al. | 117/89 |
| 6,812,495 B2 | 11/2004 | Wada et al. | |
| 6,821,825 B2 | 11/2004 | Todd | |
| 6,844,213 B2 | 1/2005 | Sparks | |
| 6,855,649 B2 | 2/2005 | Christiansen et al. | |
| 6,858,502 B2 | 2/2005 | Chu et al. | |
| 6,864,520 B2 | 3/2005 | Fischetti et al. | |
| 6,875,279 B2 | 4/2005 | Chu et al. | |
| 6,887,773 B2 | 5/2005 | Gunn, III | |
| 6,900,115 B2 | 5/2005 | Todd | |
| 6,905,972 B2 | 6/2005 | Oda | |
| 6,958,253 B2 | 10/2005 | Todd | |
| 6,995,076 B2 | 2/2006 | Wang et al. | |
| 7,026,219 B2 | 4/2006 | Pomarede et al. | |
| 7,037,856 B1 | 5/2006 | Maa et al. | |
| 7,115,521 B2 | 10/2006 | Brabant et al. | |
| 7,132,338 B2 | 11/2006 | Samoilov et al. | |
| 7,232,487 B2 | 6/2007 | Silver et al. | |
| 7,238,595 B2 | 7/2007 | Brabant et al. | |
| 7,452,757 B2 | 11/2008 | Werkhoven et al. | |
| 2002/0173104 A1 * | 11/2002 | Chang | 438/279 |
| 2003/0124818 A1 | 7/2003 | Luo et al. | |
| 2003/0162348 A1 * | 8/2003 | Yeo et al. | 438/218 |
| 2003/0207127 A1 | 11/2003 | Murthy et al. | |
| 2005/0067377 A1 | 3/2005 | Lei et al. | |
| 2006/0216417 A1 | 9/2006 | Todd et al. | |

FOREIGN PATENT DOCUMENTS

| | | |
|---|---|---|
| JP | 10-256169 | 9/1998 |
| JP | 2000-021783 | 1/2000 |
| TW | 477025 | 2/2002 |
| TW | 479281 | 3/2002 |
| TW | 483028 | 4/2002 |
| TW | 517282 | 1/2003 |
| WO | WO 00/15885 | 3/2000 |
| WO | WO 01/41544 | 6/2001 |
| WO | WO 02/097864 | 12/2002 |

OTHER PUBLICATIONS

Bauer et al., "Relaxed SiGe Buffers with Thicknesses Below 0.1 μm", *Thin Solid Films* 369:152-156 (2000).

Bensahel et al., "Single-Wafer Processing of In-Situ Doped Polycrystalline Si and $Si_{1-x}Ge_x$", *Solid State Technology*, pp. S5-S10 (Mar. 1998).

Cannon, D. et al., "Tensile Strained Epitaxial Ge Films on Si(100) Substrates with Potential Application in L-band Telecommunications," *Applied Physics Letters*, vol. 84, No. 6, Feb. 9, 2004, pp. 906-908.

Chui et al., "Ultrathin High-*k* Gate Dielectric Technology for Germanium MOS Applications", *IEEE 60th Annual Device Research Conference (DRC) Digest*, paper VII. B2, pp. 191-192 (2002).

Colace. et al., "Efficient High-Speed Near-Infrared Ge Photodetectors lintegrated on Si Substrates," *Applied Physics Letters*, vol. 76, No. 10, Mar. 6, 2000, pp. 1231-1233.

Colace et al., "Ge/Si(001) Photodetector for Near Infrared Light", *Solid State Phenomena* 54:55-58 (1997).

Colace et al. "Ge-on-Si Approaches to the Detection of Near-Infrared Light," *IEEE Journal of Quantum Electronics*, vol. 35, No. 12, Dec. 1999, pp. 1843-1852.

Colace et al., "Metal-Ge—Si Diodes for Near-Infrared light Detection", *Journal of Vacuum Science and Technology B* 17:465 (1999).

Colace et al., "Metal-Semiconductor-Metal Near-Infrared light Detector Based on Epitaxial Ge/Si", *Applied Physics Letters* 72:3175-3177 (1998).

Currie et al., "Controlling Threading Dislocation Densities in Ge on Si Using Graded SiGe Layers and Chemical-Mechanical Polishing", *Applied Physics Letters* 72:1718-1720 (1998).

Delhougne et al., "Development of a New Type of SiGe Thin Strain Relaxed Buffer Based on the Incorporation of a Carbon-Containing Layer", *Applied Surface Science* 224:91-94 (2004).

Fama, S. et al., "High Performance Germanium-on-Silicon Detectors for Optical Communications," *Applied Physics Letters*, vol. 81, No. 4, Jul. 22, 2002, pp. 586-588.

Fischetti et al., "Band Structure, Deformation Potentials, and Carrier Mobility in Strained Si, Ge, and SiGe Alloys", *Journal of Applied Physics* 80:2234-2252 (1996).

Giovane et al., "Correlation Between Leakage Current Density and Threading Dislocation Density in SiGe p-i-n Diodes Grown on Relaxed Graded Buffer Layers", *Applied Physics Letters* 78:541-543 (2001).

Hackbarth et al., "Alternatives to Thick MBE-Grown Relaxed SiGe Buffers", *Thin Solid Films* 369:148-151 (2000).

Hartmann et al., "Reduced Pressure—Chemical Vapor Deposition of Ge Thick Layers on Si(001) for 1.3-1.55-μm Photodetection", *Journal of Applied Physics* 95:5905-5913 (2004).

Hull, R., "Metastable Strained Layer Configurations in the SiGe—Si System," (1999) *EMIS Datareviews, Series No. 24: Properties of SiGe and SiGe:C*,edited by Erich Kasper et al., INSPEC (2000), London, UK.

International Search Report for International Application No. PCT/US04/07564 dated Apr. 6, 2005.

Ishikawa, Y. et al., "Strain-Induced Band Gap Shrinkage in Ge Grown on Si Substrate," *Applied Physics Letters*, vol. 82, No. 12, Mar. 31, 2003, pp. 2044-2046.

Jackson et al., "Gate-Self-Aligned p-Channel Germanium MISFET's", *IEEE Electron Device Letters* 12:605-607 (1991).

Kasper, "Prospects of SiGe Heterodevices", *Journal of Crystal Growth* 150:921-925 (1995).

Kasper et al., "New Virtual Substrate Concept for Vertical MOS Transistors", *Thin Solid Films* 336:319-322 (1998).

Lee et al., "Electron mobility characteristics of *n*-channel metal-oxide-semiconductor field-effect transistors fabricated on Ge-rich single- and dual-channel SiGe heterostructures", *Journal of Applied Physics* 95:1550-1555 (2004).

Lee et al., "Growth of strained Si and strained Ge heterostructures on relaxed $Si_{1-x}G_{ex}$ by ultrahigh vacuum chemical vapor deposition," J. Vac. Sci. Technol. B 22(1) (Jan.-Feb. 2004).

Lee et al., "Strained Ge channel p-type metal-oxide-semiconductor field-effect transistors grown on $Si_{1-x}Ge_x$-Si virtual substrates", *Applied Physics Letters* 79:3344-3346 (2001).

Lee et al., "Strained Si-strained Ge dual-channel heterostructures on Relaxed $Si_{0.5}Ge_{0.5}$ for symmetric mobility *p*-type and *n*-type metal-oxide-semiconductor field-effect transistors", *Applied Physics Letters* 83:4202-4204 (2003).

Letertre et al., "Germanium-on-insulator (GeOI) structure realized by the Smart Cut™ technology", *MRS Proceedings*, vol. 809 (2004).

Li et al., "Selective growth of Ge on Si(100) through vias of $SiO_2$ nanotemplate using solid source molecular beam epitaxy," Applied Physics Letters, vol. 83, No. 24, Dec. 15, 2003, pp. 5032-5034.

Liu et al., "Experimental Study of a Surficant-Assisted SiGe Graded Layer and a Symmetrically Strained Si-Germanium Superlattic for Thermoelectric Applications", Thin Solid Films 369:121-125 (2000).

Liu et al., "Silicidation—induced band gap shrinkage in Ge epitaxial films on Si," Applied Physics Letters, vol. 84, No. 5, Feb. 2, 2004, pp. 660-662.

Luan et al., "High-quality Ge epilayers on Si with low threading-dislocation densities", *Applied Physics Letters* 75:2909-2911 (1999).

Lyutovich et al., "Interaction between point defects and dislocations in SiGe", *Solid State Phenomena* 69-70:179-184 (1999).

Lyutovich et al., "Relaxed SiGe buffer layer growth with point defect injection", *Materials Science and Engineering* B71:14-19 (2000).

Lyutovich et al., "Thin SiGe buffers with high Ge content for n-MOSFETs", *Materials Science and Engineering* B89:341-345 (2002).

Masini, G et al.; "High-Performance p-i-n Ge on Si Photodetectors for the Near Infrared: From Model to Demonstration," *IEEE Transactions of Electron Devices*, vol. 48, No. 6, Jun. 2001, pp. 1092-1096.

Ni et al., "X-ray reciprocal space mapping studies of strain relaxation in thin SiGe layers ($\leqq 100$ nm) using a low temperature growth step", *Journal of Crystal Growth* 227-228:756-760 (2001).

Osten et al., "Relaxed $Si_{1-x}Ge_x$-$Si_{1-x-y}Ge_xC_y$ Buffer Structures with Low Threading Dislocation Density", *Applied Physics Letters* 70:2813-2815 (1997).

"Physics of Thin Films", printed from http:--www.uccs.edu-~tchriste-courses-PHYS549-549lectures-film2.html (Feb. 22, 2000).

Reinking et al., "Ge p-MOSFETs compatible with Si CMOS-technology", *Proceedings of the 29th ESSDERC* 99:300-303 (1999).

Samavedam et al., "High-quality germanium photodiodes integrated on silicon substrates using optimized relaxed graded buffers", *Applied Physics Letters* 73:2125-2127 (1998).

Schöllhorn et al., "Coalescence of germanium islands on silicon", *Thin Solid Films* 336:109-111 (1998).

Shang et al., "Electrical characterization of germanium *p*-channel MOSFETs", *IEEE Electron Device Letters* 24:242-244 (2003).

Thomas et al., "Structural characterization of thick, high-quality epitaxial Ge on Si substrates grown by low-energy plasma-enhanced chemical vapor deposition", *Journal of Electronic Materials* 32:976-980 (2003).

Vescan et al., "Relaxation Mechanism of Low Temperature SiGe—Si(100) Buffer Layers", ICSI3, p. 141 (Mar. 2003).

Taiwanese Office Action dated Apr. 30, 2010 for Taiwanese Patent Application No. 093106618.

* cited by examiner

EPITAXIAL SEMICONDUCTOR DEPOSITION METHODS AND STRUCTURES

RELATED APPLICATION INFORMATION

This application is a continuation of U.S. application Ser. No. 11/755,528, filed May 30, 2007, which is a continuation of U.S. application Ser. No. 10/800,390, filed Mar. 12, 2004, now issued as U.S. Pat. No. 7,238,595, which claims priority under 35 U.S.C. §119(e) to U.S. Provisional Patent Application No. 60/455,226, filed Mar. 13, 2003, U.S. Provisional Patent Application No. 60/470,584, filed May 14, 2003, and to U.S. Provisional Application No. 60/545,442, filed Feb. 17, 2004, all of which are hereby incorporated by reference in their entireties.

This application is also related to U.S. Provisional Patent Application No. 60/548,269, filed Feb. 27, 2004, U.S. Provisional Application No. 60/556,752, filed Mar. 26, 2004, U.S. application Ser. No. 10/993,024, filed Sep. 18, 2004, now issued as U.S. Pat. No. 7,115,521 and U.S. application Ser. No. 11/506,320, filed Aug. 18, 2006, now issued as U.S. Pat. No. 7,402,504.

BACKGROUND OF THE INVENTION

1. Field of the Invention

This invention relates to methods for depositing silicon (Si) and germanium (Ge) in various manufacturing process, such as in semiconductor manufacturing. More particularly, this invention relates to methods for depositing epitaxial films such as epitaxial $Si_xGe_{1-x}$ films, in which x is in the range from zero to one.

2. Description of the Related Art $Si_xGe_{1-x}$ films are used in a wide variety of semiconductor applications. An issue that often arises during the production of these materials is the lattice strain that may result from heteroepitaxial deposition. A "heteroepitaxial" deposited layer is an epitaxial or single crystal film that has a different composition than the single crystal substrate onto which it is deposited. A deposited epitaxial layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions that they would normally occupy in the lattice structure of the free-standing, bulk material when the film deposits in such a way that its lattice structure matches that of the underlying single crystal substrate. For example, heteroepitaxial deposition of a Ge-containing material such a SiGe or Ge itself onto a single crystal Si substrate generally produces compressive lattice strain because the lattice constant of the deposited Ge-containing material is larger than that of the Si substrate. The degree of strain is related to the thickness of the deposited layer and the degree of lattice mismatch between the deposited material and the underlying substrate.

Strain is in general a desirable attribute for active device layers, since it tends to increase the mobility of electrical carriers and thus increase device speed. In order to produce strained layers on conventional silicon structures, however, it is often helpful to create a strain relaxed, intermediate heteroepitaxial layer to serve as a template for a further strained layer that is to remain strained and serve as an active layer with increased carrier mobility. These intermediate films are often provided by a relaxed $Si_xGe_{1-x}$ "buffer" layer over single crystal unstrained silicon (e.g., wafer surface), which can be engineered to provide the desired strain of an overlying layer (e.g., strained silicon layer).

Many microelectronic devices incorporate Ge-containing layers such as SiGe. To provide increased device performance, it is usually advantageous to have a relatively high germanium content in the SiGe layer. When deposited onto a single crystal Si substrate or layer, greater amounts of germanium generally increase the amount of strain. Generally, the higher the Ge content, the greater the lattice mismatch with underlying Si, up to pure Ge, which has a 4% greater lattice constant compared to silicon. As the thickness of the SiGe layer increases above a certain thickness, called the critical thickness, the SiGe layer relaxes automatically to its inherent lattice constant, which requires the formation of misfit dislocations at the film/substrate interface. The critical thickness depends upon temperature (the higher the temperature, the lower the critical thickness) and mismatch due to germanium content (the higher [Ge], the lower the critical thickness). For example, SiGe containing about 10% germanium has a critical thickness of about 300 Å at about 700° C. for an equilibrium (stable) strained film and about 2,000 Å for a metastable, strained film on Si<100>. If it is desirable to maintain the strain, the thickness is kept below the critical thickness and a cap layer is often applied to the strained heteroepitaxial layer to maintain the (metastable) strain of the SiGe layer during subsequent processing steps, e.g., to facilitate the formation of an emitter-base junction at the desired depth within the structure.

Although sometimes the relaxation is desired, when forming a buffer for subsequent strained deposition, the relaxation should be controlled to avoid some types of dislocations, such as vertically propagating or threading dislocations. Such dislocations lead to reduced carrier mobility, current leakage, reduced device performance and even device failure.

The quality of a deposited epitaxial layer generally depends on the cleanliness and crystal quality of the substrate onto which it is deposited. Since the substrate surface acts as a template for the deposited layer, any substrate surface contamination tends to degrade the quality of the deposited layer. Many epitaxial deposition processes employ a so-called "bake" step in which the substrate is heated to drive off surface contaminants such as oxygen and carbon immediately prior to epitaxial deposition.

SUMMARY OF THE INVENTION

One aspect of the invention provides a method for depositing an epitaxial Ge-containing layer, comprising
    heating a single crystal Si structure to a first temperature;
    cooling the single crystal Si structure to a second temperature during a cooling time period;
    contacting the single crystal Si structure with a surface active compound during at least a portion of the cooling time period; and
    depositing an epitaxial layer over the single crystal Si structure at the second temperature.

Another aspect provides a process for forming a strained semiconductor layer over a substrate, comprising:
    forming a relaxed epitaxial Ge layer over the substrate;
    depositing a relaxed epitaxial SiGe alloy layer onto the relaxed epitaxial Ge layer, the relaxed SiGe alloy layer having an increasing Si content with distance from an interface with the relaxed epitaxial Ge layer; and
    depositing a strained epitaxial semiconductor layer onto the relaxed epitaxial SiGe alloy layer.

Another aspect provides a semiconductor structure, comprising
   a single crystal Si structure;
   an epitaxial Ge layer deposited on the single crystal Si layer; and
   a SiGe alloy layer deposited on the epitaxial Ge layer.

Another aspect provides an epitaxial semiconductor deposition system, comprising
   a deposition chamber configured to support at least one workpiece;
   a surface active compound source vessel containing a surface active compound, the surface active compound source vessel being operatively connected to the chamber to allow the surface active compound to flow into chamber;
   a germanium source vessel containing a germanium precursor, the germanium source vessel being operatively connected to the chamber to allow the germanium precursor flow into the chamber;
   a heater configured to heat the at least one workpiece; and
   a computer operatively connected to and set to control flow of the surface active compound and the germanium precursor, and to control the temperature of the workpiece to conduct in sequence a high temperature process step, a cooling step and a low temperature Ge-containing epitaxial deposition step, wherein the controls provide the surface active compound to the at least one workpiece during at least a lower temperature portion of the cooling step.

Another aspect provides a method for depositing an epitaxial Ge layer, comprising
   providing substrate having a single crystal semiconductor surface disposed within a reactor;
   heating the substrate to a first temperature of about 450° C. or higher;
   cooling the substrate to a second temperature during a cooling time period, the reactor having a reactor pressure in the range of about 0.001 Torr to about 760 Torr during said cooling period;
   contacting the single crystal semiconductor surface with a surface active compound selected from the group consisting of Si precursors and Ge precursors during at least a portion of the cooling time period; and
   depositing an epitaxial Ge layer onto the single crystal semiconductor surface at the second temperature.

Another aspect provides a method for depositing an epitaxial Ge layer. The method includes:
   providing a single crystal Si substrate disposed within a single wafer reactor;
   heating the single crystal Si substrate to a first temperature of about 600° C. or higher;
   cooling the single crystal Si substrate to a second temperature of about 450° C. or less during a cooling time period, the reactor having a reactor pressure in the range of about 1 Torr to about 100 Torr during said cooling time period; and
   depositing an epitaxial Ge layer over the single crystal Si substrate at the second temperature.

Another aspect provides a multi-layer semiconductor structure comprising:
   an underlying single crystal silicon structure; and
   an overlying epitaxial germanium layer directly over the silicon structure having an as-deposited threading dislocation density of about $10^7$ defects/cm$^2$ or less, as measured by an etch pit decoration method, and an as-deposited surface roughness of about 20 Å rms or less, as measured by atomic force microscopy across at least a 10 micron×10 micron window.

These and other aspects are described in greater detail below.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF THE PREFERRED EMBODIMENTS

Figure 1:
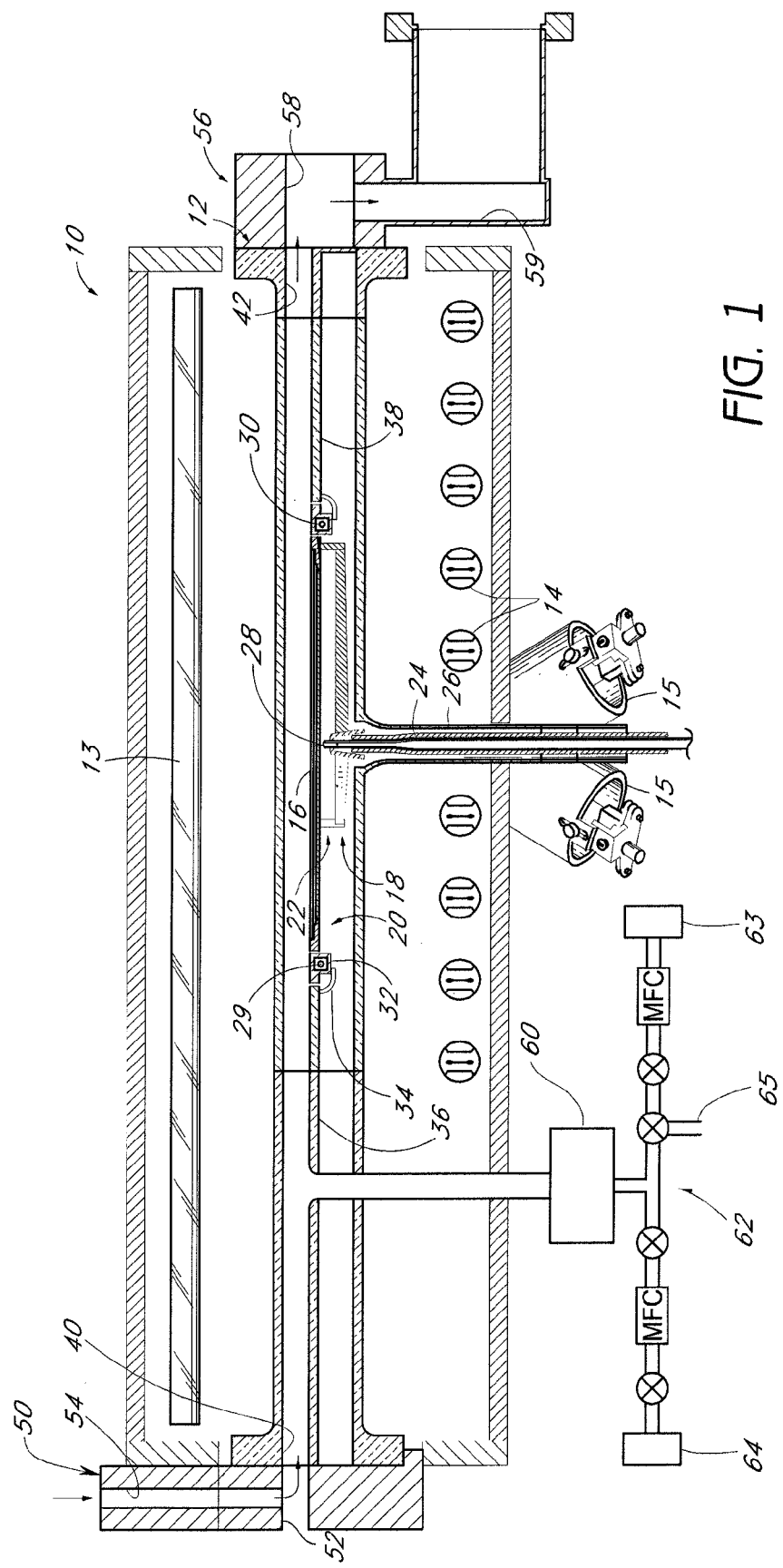
FIG. 1 is a partially schematic cross-sectional view of a single wafer chamber for processing wafers in accordance with one embodiment of the present invention.

This invention provides a number of embodiments involving methods for depositing $Si_{1-x}Ge_x$ films and the $Si_{1-x}Ge_x$ films deposited thereby, in which x is in the range from zero to one. Several embodiments provide a solution to the problem of single crystal Si surface contamination during deposition. For example, various semiconductor fabrication processes involve the deposition of a Ge-containing material onto a Si-containing substrate. "Substrate," as used herein, can refer to a bare wafer or to such a workpiece with layers already formed on it. Frequently, the Si-containing substrate is heated during a preceding process step (e.g., to deposit or clean an epitaxial Si layer) to a much higher temperature than that used for the subsequent deposition of the Ge-containing material, so that there is a cooling period between the two steps. In many cases, the difference in temperature between the two steps results from the higher decomposition temperatures used for the silicon precursor (e.g., silane) used to deposit a prior layer of Si-containing material, or the higher temperatures used during an initial reducing or bake step, and the lower decomposition temperatures used for the germanium precursor (e.g., germane) used to deposit the Ge-containing material. During this cooling period, it is highly desirable for the surface of the Si-containing substrate to be kept free of contamination by e.g., oxygen or carbon. Thus, traditional low pressure chemical vapor deposition systems have not been widely used for this purpose because of the contamination potential. Ultra-high vacuum systems have been used to prevent contaminants from contacting the surface, but such systems are not always convenient and may represent additional costs.

For example, single crystal Ge films are useful in a number of microelectronic and optoelectronic applications, but widespread use has been limited by the relatively high cost of Ge substrates as compared to Si. A potentially lower cost substrate may be formed by depositing a layer of single crystal Ge on a single crystal Si substrate. However, in practice the resulting single crystal Ge layers generally have a relatively high level of defects (particularly for thin Ge layers), which result from lattice mismatch between the underlying Si and the overlying Ge. Pure Ge has a lattice constant about 4% greater than that of pure Si. In addition, the surface of the deposited Ge is often much rougher than desired.

To prepare a single crystal Si substrate for epitaxial Ge deposition, the Si substrate is typically cleaned by baking at about 450° C. or higher, often 900° C. or higher. Since Ge films deposited at high temperatures generally have a high degree of surface roughness, the single crystal Si substrate is desirably cooled to a temperature of less than 600° C., more preferably about 450° C. or less. To minimize surface contamination, the cleaned Si substrate is generally maintained under vacuum during cooling, and subsequent Ge deposition is typically conducted at very low pressures by Ultra High Vacuum Chemical Vapor Deposition (UHVCVD) or Molecular Beam Epitaxy (MBE).

However, such low pressure deposition may be slower than desired for some fabrication processes, and impractical for production worthy single wafer deposition tools, and the resulting single crystal Ge layer typically has a relatively high level of defects. For example, a threading defect density (TDD) of about $10^{10}$ defects/cm$^2$ has been reported for an epitaxial Ge film deposited on a Si substrate by UHVCVD. The defect density was reduced to about $10^7$ defects/cm$^2$ by annealing, but in some process flows the additional annealing step may be undesirable.

In one embodiment of the instant invention, the high temperature Si-containing surface is protected from contamination during cooling by contacting the Si-containing surface (e.g., epitaxial Si substrate) with a surface active compound, preferably a Si or Ge source chemical, during a least part of the time that the surface is cooling. The term "surface active compound" refers to a chemical compound that protects a single crystal Si-containing surface from contamination without interfering with the epitaxial or heteroepitaxial deposition of the subsequent layer. The surface active compound is most preferably a Si compound.

Without being limited by theory, the surface active compounds may exert their surface protective effect by various mechanisms. One possible mechanism is that the surface active compound forms a physisorbed protective layer on the surface that limits the ability of oxygen and carbon to contaminate the surface. In this mechanism, the surface active compound does not form a permanent chemical bond to the surface, and thus is easily displaced by the Si and/or Ge precursor(s) used to deposit the next layer. Surface active compounds acting by this mechanism preferably contain Si or Ge, but the presence of these elements is not required because the subsequent displacement of the surface active compound reduces or eliminates the potential for surface contamination by other elements in the surface active compound.

Another possible mechanism may be operative in surface active compounds that contain Si or Ge as well as additional ligands. During cooling, the Si or Ge in the surface active compound forms a chemical bond to the Si-containing surface (chemisorption). Multiple layers of the surface active compound may be deposited on the surface during the cool down. At least a portion of the ligand(s) in the surface active compounds are then displaced, e.g., by the Si and/or Ge precursor(s) used to deposit the next layer, and/or by a third component that removes part or all of the surface active compound. When only part of the surface active compound is removed, some of the Si or Ge originally in the surface active compound is then incorporated into the resulting layer formed by subsequent deposition using Si and/or Ge precursor(s). Other mechanisms may also be operative. Thus, while discussion of the various embodiments herein may include a reference to a particular operative mechanism, it will be understood that such reference is for the purposes of illustration and that other mechanisms may be operative in a particular situation.

Regardless of the operative mechanism, it has been found that such surface active compounds decrease or prevent contamination and thus improve the quality of subsequently deposited Ge-containing materials (e.g., epitaxial Ge and SiGe). Preferably, the surface active compound undergoes little or no thermal decomposition under the conditions and during the time that the Si-containing surface is cooling, so that deposition on the Si-containing surface during that time is minimized or avoided. Furthermore, the surface active compound is selected to not condense on the Si-containing surface during cooling. Regardless of the operative mechanism, the surface active compound is preferably a silane (e.g., silane, disilane, or trisilane), a germane (e.g., germane, digermane), halogermane (e.g., chlorogermanes), an organosilane (e.g., alkylsilane, arylsilane, or alkylarylsilane), or a halosilane that does not undergo significant thermal decomposition at the temperature and pressure conditions present during cooling. Depending on the cooling conditions, preferred surface active compounds include silane, disilane, trisilane, chlorosilane, dichlorosilane, trichlorosilane, tetrachlorosilane, methylsilane, dimethylsilane, trimethylsilane, tetramethylsilane, germane, digermane, dichlorogermane, trichlorogermane, tetrachlorogermane, etc. Si compounds are in general preferred over Ge compounds for the surface active compound because deposition during cooling will be minimized and any deposited silicon will have a reduced tendency (compared to Ge) to agglomeration during the cooling from high temperatures, although use of certain halogermanes (e.g., chlorogermanes) as the surface active compound advantageously will exhibit minimal germanium deposition during the cool down. Dichlorosilane (DCS) has been found particularly effective in experiments, as discussed further below. It will be understood that mixtures of the above-noted chemicals can also be employed in some circumstances.

As mentioned above, the high temperature Si-containing surface is preferably protected from contamination during cooling by contacting the Si-containing surface (e.g., epitaxial Si layer) with a surface active compound during at least part of the time that the surface is cooling. This embodiment is preferably conducted by first heating an epitaxial Si layer or bare wafer to a first preferred temperature of about 450° C. or higher, more preferably about 600° C. or higher, and in the illustrated embodiment is about 900° C. or higher. Such heating may take place during deposition of the epitaxial Si layer using a silicon precursor, e.g., silane, or during baking to sublime native oxides and/or drive off surface contaminants. In either case, a single crystal Si substrate is then cooled to a second temperature during a cooling period. The second temperature may be any temperature that is lower than the first temperature, and is preferably in a range that is appropriate for a subsequent heteroepitaxial deposition. In a preferred embodiment, the subsequent deposition forms a Ge-containing layer, e.g., an epitaxial Ge layer. For example, it has been found that the deposition of epitaxial Ge onto single crystal Si at temperatures higher than 450° C. using germane tends to result in incomplete surface coverage (for very thin films) and rough surfaces (for thicker films), possibly resulting from the formation of clusters or islands of deposited Ge atoms. Therefore, deposition using germane is preferably conducted at temperatures in the range of about 300° C. to about 450° C., more preferably in the range of about 300° C. to about 350° C. Temperature dependence of the islanding effect is illustrated, e.g., in Schollhorn et al., "Coalescence of germanium islands on silicon," *Thin Solid Films*, Vol. 336 (1998), pp. 109-111.

To reduce or prevent contamination during the cooling period (e.g., between a bake step or the epitaxial Si deposition using silane and the later time that the epitaxial Ge or SiGe is deposited using germane), the epitaxial Si surface is preferably contacted with a surface active compound during at least part of the cooling period. Depending on the cooling conditions, preferred surface active compounds for this purpose include silanes (e.g., silane, disilane, and trisilane), halosilanes (e.g., chlorosilane, dichlorosilane, trichlorosilane, and tetrachlorosilane), alkylsilanes (e.g., methylsilane, dimethylsilane, trimethylsilane and tetramethylsilane), germanes (e.g., germane, digermane) and halogermanes (e.g., dichlorogermane, trichlorogermane, tetrachlorogermane). For example, in a preferred embodiment, an epitaxial silicon substrate is cooled to a temperature in the range of about 300° C. to about 450° C. During cooling, the single crystal silicon substrate is preferably contacted with a surface active compound that undergoes little or no thermal decomposition under the cooling conditions (e.g., temperature, pressure, cooling rate). Dichlorosilane and trichlorosilane are examples of particularly preferred surface active compounds suitable for use in this embodiment. The contacting of the surface active compound with the Si-containing substrate during the cooling period is preferably carried out by flowing or diffusing the surface active compound across the surface of the substrate. Routine experimentation may be used to select a flow rate that supplies an amount of surface active compound to the surface that is effective to reduce or avoid contamination during cooling.

After cooling to the second temperature, the deposition of the Ge-containing layer is preferably carried out by contacting the epitaxial Si surface with a germanium precursor. Preferred germanium precursors include germane, digermane and trigermane. Preferably, the second temperature is in the range of about 300° C. to about 450° C. The Ge-containing layer is preferably an epitaxial Ge-containing layer having a Ge content in the range of about 50 atomic % to about 100 atomic %, more preferably about 99 atomic % Ge or higher. In a preferred embodiment, the Ge-containing layer is epitaxial Ge (doped or undoped). The Ge-containing layer may be a SiGe layer, in which case the germanium precursor preferably further comprises a silicon precursor that can be different from the surface active compound, such as disilane or trisilane (which tend to have lower decomposition temperatures than silane). Typically, the silicon precursor decomposes or otherwise reacts during deposition, e.g., during epitaxial chemical vapor deposition (CVD). The relative amounts of germanium precursor and silicon precursor may be held relatively constant during the deposition, or varied to provide a graded SiGe layer.

Heating of the single crystal Si structure (including deposition, if desired), cooling, contacting with a surface active compound, contacting with a germanium precursor (and silicon precursor, if any) and subsequent deposition of the Ge-containing layer are all preferably conducted in a suitable chamber. Examples of suitable chambers include batch furnaces and single wafer reactors. An example of a preferred chamber is a single-wafer, horizontal gas flow reactor, preferably radiatively heated. Suitable reactors of this type are commercially available, and preferred models include the Epsilon® series of single wafer epitaxial reactors commercially available from ASM America, Inc. of Phoenix, Ariz. FIG. 1 illustrates such a reactor. While the processes described herein can also be employed in alternative reactors, such as a showerhead arrangement, benefits in increased uniformity and deposition rates have been found particularly effective in the horizontal, single-pass, laminar gas flow arrangement of the Epsilon® chambers. A suitable manifold may be used to supply the silicon precursor, surface active compound, and germanium precursor to the thermal chemical vapor deposition chamber in which the deposition is preferably conducted. Preferred gas flow rates can be determined by routine experimentation, depending on the size of the deposition chamber.

FIG. 1 illustrates a preferred single wafer chemical vapor deposition (CVD) reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control to have utility in CVD of a number of different materials, including SiGe and Ge films. Moreover, the illustrated reactor 10 can safely and cleanly accomplish multiple deposition steps in the same chamber 12, as will be apparent from the discussion of the preferred processes, discussed below. As noted below, the basic configuration of the reactor 10 is available commercially under the trade name Epsilon® from ASM America, Inc. of Phoenix, Ariz.

A plurality of radiant heat sources is supported outside the chamber 12 to provide heat energy in the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12. Each of the elongated tube type heating elements 13, 14 is preferably a high intensity tungsten filament lamp producing radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A workpiece, preferably comprising a silicon wafer 16, is shown supported within the reaction chamber 12 upon a substrate support structure 18. The illustrated support structure 18 includes a substrate holder 20, upon which the wafer 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12. Sweep gas preferably also flows horizontally beneath the wafer to aid in minimizing contaminant leakage from below.

A plurality of temperature sensors is positioned in proximity to the wafer 16. The temperature sensors may take any of a variety of forms, such as optical pyrometers or thermocouples. In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples is housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, slip ring 32 can reduce the risk of radial temperature non-uniformities across the wafer 16. The slip ring 32 can be suspended by any suitable means. For example, the illustrated slip ring 32 rests upon elbows 34, which depend from a front chamber divider 36, and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from gas sources and communicates such gases with the slot 52 and the inlet port 40. While not separately illustrated in FIG. 1, the skilled artisan will readily appreciate in view of the disclosure herein that the gas sources preferably include hydrogen, silicon and germanium precursors, and that controls (e.g., pre-programmed computer) are provided and configured to conduct a sequence of steps as described herein, including bleeding the surface active compound into the chamber during a cool down step prior to Ge-containing deposition. The inlet 54 can include gas injectors as described in U.S. Pat. No. 5,221,556, issued Hawkins et al., or as described with respect to FIGS. 21-26 in U.S. Pat. No. 6,093,252, issued to Wengert et al., the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for reduced pressure processing, i.e., below atmospheric pressure but well above UHV-CVD pressure ranges, as discussed below.

The illustrated reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TR-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the generation 60 and thence into the reaction chamber 12. The excited species generator can be employed for plasma enhanced deposition, but in the illustrated embodiments is employed for exciting etchants for cleaning the chamber 12 of excess deposition when no wafer is housed in the chamber 12.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

Routine experimentation can be used to determine the deposition conditions (e.g., deposition temperature and deposition pressure) for any particular $Si_{1-x}Ge_x$ layer. As discussed above, deposition temperatures for the Ge-containing layer are typically in the range of about 250° C. to 600° C., more preferably about 300 to about 450° C., depending on the nature of the germanium precursor. For example, lower deposition temperatures tend to be more appropriate as the thermal stability of the precursor decreases. The total pressure in the CVD chamber is in the range of about $10^{-5}$ Torr to about 800 Torr. In the case of the single wafer chamber of FIG. 1, the pressure is preferably in the range of about 200 mTorr to about 760 Torr, even more preferably about 1 Torr to about 200 Torr, most preferably in the range of about 1 Torr to about 60 Torr.

Figure 2:
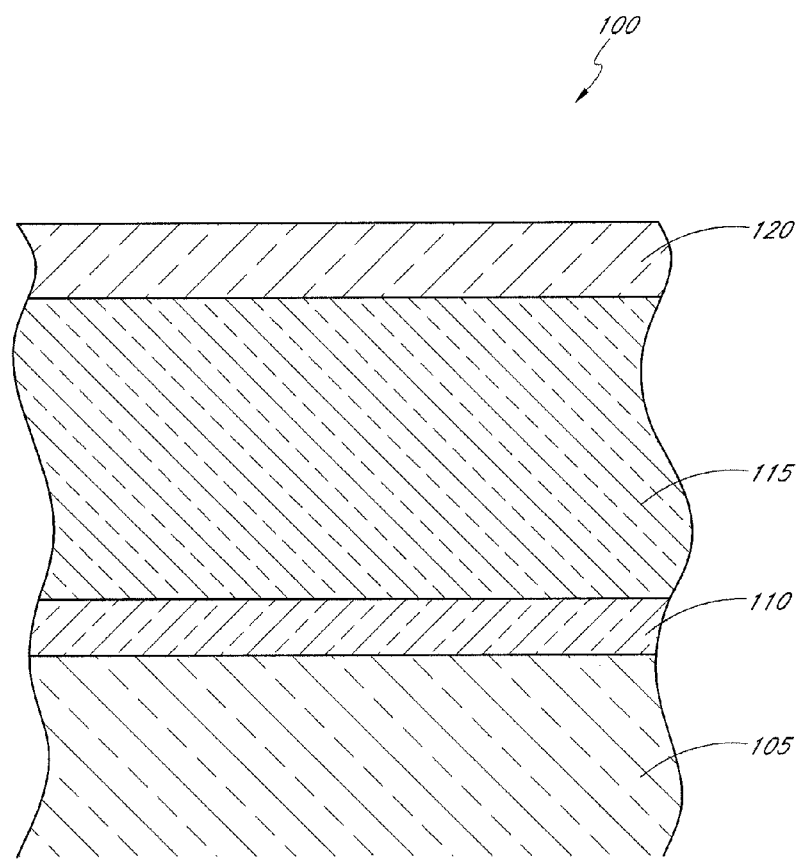
FIG. 2 shows a schematic cross sectional view of a preferred multilayer film.

FIG. 2 illustrates a semiconductor structure 100 that can be provided in accordance with one embodiment. The structure 100 comprises a single crystal Si structure 105 (e.g., epitaxial Si layer or single crystal Si wafer surface), a thin epitaxial Ge-containing layer 110 deposited on the single crystal Si structure 105, and a $Si_{1-x}Ge_x$ layer 115 deposited on the epitaxial Ge-containing layer 110, where x is in the range from zero to one. As discussed below, the epitaxial Ge-containing layer 110 preferably has a high Ge content, more preferably 50 at. % to 100 at. % Ge, particularly pure Ge, and the $Si_{1-x}Ge_x$ layer 115 preferably comprises a lower Ge content SiGe alloy that serves as a relaxed buffer. It has been found that such films allow the $Si_{1-x}Ge_x$ layer to have a reduced defect density, both for a given thickness and absolutely. A preferred application for the combined thin epitaxial Ge layer and $Si_{1-x}Ge_x$ layer is as a relaxed buffer layer between an underlying unstrained single crystal Si structure 105 and an overlying strained Si epitaxial layer 120. The combined thin epitaxial Ge-containing layer 110 and $Si_{1-x}Ge_x$ layer 115 may also be used in other applications.

As noted, it has been found that a SiGe layer can be used as a relaxed buffer layer between an underlying unstrained single crystal Si structure and an overlying strained Si epitaxial layer. In these structures, the SiGe layer (e.g., a graded SiGe layer) is deposited on the underlying unstrained single crystal Si structure. The SiGe layer may be strained initially, e.g., because it has a larger lattice constant than Si but the actual crystal is forced to align with the underlying unstrained single crystal Si structure. Ultimately, the SiGe layer is relaxed, such as by heating or deposition beyond the critical thickness, so that it adopts its natural lattice constant, which is higher than the underlying unstrained epitaxial Si layer. The overlying strained epitaxial Si layer that is deposited on the relaxed SiGe layer is strained because it is forced to align with the larger lattice constant of the relaxed SiGe buffer layer. Thus, use of the relaxed SiGe buffer layer provides a way to produce an overlying strained epitaxial Si layer.

However, it has been found that such use of SiGe often presents problems. For example, the relaxation of the SiGe typically produces various crystal defects (e.g., misfit dislocations and threading dislocations), since relaxation represents a transition in crystal structure from the smaller lattice constant of the underlying templating Si structure. Misfit dislocations are needed to allow the relaxation. The presence of threading dislocations in the SiGe, however, particularly near the upper SiGe surface, may introduce corresponding defects into the epitaxial Si layer that is deposited onto the SiGe layer. It has been found that the defect density can be reduced by using a thick graded SiGe buffer layer. As is known in the art, such thick graded SiGe buffer layers start with a high Si content and gradually introduce greater amounts of Ge as deposition proceeds until the desired proportion of Ge is left at the upper surface to set the crystal mismatch for an overlying strained layer. The critical thickness is thus higher than with a uniform composition at the target concentration, and when relaxation does occur, the threading dislocations tend to have a reduced density. But such thick layers are disfavored because of the cost and deposition time needed to produce them.

It has now been found that thinner $Si_{1-x}Ge_x$ (preferably SiGe) buffer layers may be used in such applications by placing a thin epitaxial Ge-containing layer with high Ge content (e.g., about 40 at. % or higher, more preferably 50 at. % or higher) between the underlying unstrained epitaxial Si layer and the $Si_{1-x}Ge_x$ buffer layer. This invention is not bound by theory, but it is believed that the thin epitaxial high Ge content layer provides a medium in which the gliding propagation of dislocations in the $Si_{1-x}Ge_x$ can proceed at a high velocity. "Horizontal" or gliding propagation velocity of the dislocations is higher when the Ge content is higher, so that the thin epitaxial Ge-containing layer (between the underlying unstrained single crystal Si structure and the $Si_{1-x}Ge_x$ layer) preferably has a higher Ge content than the overlying $Si_{1-x}Ge_x$ layer. See R. Hull, "Metastable strained layer configurations in the SiGe/Si system," (1999) *EMIS Datareviews, Series No.* 24: *Properties of SiGe and SiGe:C*, edited by Erich Kasper et al., INSPEC (2000), London, UK. Preferably, the thin epitaxial Ge-containing layer is an epitaxial Ge layer. The thickness of the thin epitaxial Ge-containing layer may be varied, depending on the defect density and thickness that can be tolerated in the overlying $Si_{1-x}Ge_x$ layer, but is preferably in the range of from about 10 Å to 1 μm, more preferably about 10 Å to about 500 Å, and most preferably about 15 Å to about 300 Å.

The multilayer structure 100 (including the thin epitaxial Ge-containing layer) is preferably deposited as described herein, e.g., by depositing a high [Ge] Ge-containing layer 110 (e.g., epitaxial Ge) onto a single crystal Si substrate 105 after cooling the Si substrate in contact with a surface active compound. It will be understood, however, that the benefits of the structures and sequences for forming buffers as described below can be obtained without the surface active compound during cooling. The $Si_{1-x}Ge_x$ layer 115 deposited onto the thin epitaxial Ge-containing layer 110 preferably has a lower dislocation density than a comparable $Si_{1-x}Ge_x$ layer deposited directly onto the single crystal Si structure 105. The $Si_{1-x}Ge_x$ layer 115 is preferably an epitaxial SiGe layer having a Ge content in the range of about 1 atomic % to about 99 atomic %, more preferably about 40 atomic % to about 80 atomic %. The $Si_{1-x}Ge_x$ layer 115 in accordance with this embodiment contains both Si and Ge (a SiGe alloy), such that the deposition is preferably conducted using a germanium precursor and a silicon precursor (e.g., silane, disilane, trisilane) as discussed above. The relative amounts of germanium precursor and silicon precursor may be held relatively constant during the deposition, or, preferably, varied to provide a graded SiGe layer.

As will be understood by the skilled artisan in view of the present disclosure, by starting with a high Ge content, dislocations generated by the lattice mismatch between the buffer structure and the underlying single crystal Si are largely taken up in the initial high Ge content (e.g., pure Ge) layer 110 and more readily glide out of the layer. This benefit is obtained even without a separate anneal step, though annealing can also be performed. The higher the initial Ge content, the greater the benefit, such that a "pure" Ge layer (with or without electrical doping) is most preferred. Such pure Ge has a very low critical thickness, which in combination with the ability to deposit thin, smooth continuous Ge films with minimal dislocation density, as described elsewhere herein, allows a very thin Ge film that relaxes naturally upon deposition. The overlying SiGe portion 115 of the buffer layer can then be graded to reduce Ge content until the desired proportion of Ge is left at the upper surface to set the crystal mismatch for an overlying strained layer. Grading can be accomplished by grading the deposition temperature, adjusting the deposition pressure, adjusting relative Ge- and Si-precursor flows, or by a combination of the three. For example, for a high Ge content, low temperatures are preferably used to avoid islanding, and high pressure (e.g., 100 Torr) initially employed to aid in maintaining both high deposition rates and high Ge content. As the deposition proceeds and lower Ge content is desired, for some reactant combinations (e.g., DCS and $GeH_4$) temperature is preferably increased and pressure decreased (to, e.g., 20 Torr). The SiGe layer 115 can be made thinner for a given density of dislocations, compared to known buffer deposition techniques. The described buffer can be described as "retrograde," since the Ge concentration is inverted relative to conventional graded SiGe buffers. Grading can be more abrupt than with a conventional SiGe buffer, since the high Ge content at the underlying Si/Ge interface allows dislocations to glide out more readily, such that the overall buffer thickness can be reduced without higher dislocation densities.

Preferably deposition of the graded SiGe layer 115 leaves a top surface with a Ge content between about 40% and 80%, more preferably about 45% to 60%. In one arrangement, the final Ge concentration is about 50%. Advantageously, 50% Ge enables deposition of at least one strained semiconductor layer 120, such as strained Si and/or strained Ge, over the SiGe buffer layer 115.

At 50% Ge concentration, the lattice constant of the relaxed buffer is symmetrically larger and smaller than the lattice constant of pure Si and pure Ge, respectively. Thus, the strained semiconductor layer 120 can comprise both a strained Si and a strained Ge layer over the buffer, in accordance with a dual channel CMOS design, described by Lee et al. of the Massachusetts Institute of Technology, for example in Lee et al. "Growth of strained Si and strained Ge heterostructures on relaxed $Si_{1-x}Ge_x$ by ultrahigh vacuum chemical vapor deposition," J. Vac. Sci. Technol. B 22(1) (January/February 2004), the disclosure of which is incorporated herein by reference. As described by Lee et al., the strained Ge lower channel provides highly enhanced hole or positive carrier mobility, while the strained Si upper channel provides highly enhanced electron or negative carrier mobility.

One of the problems described by Lee et al. is the ability to produce thin, smooth Ge films. Ge deposition techniques prior to the present disclosure have been found difficult, even with the UHVCVD techniques described by Lee et al. The Ge deposition techniques described hereinabove have been found to produce excellent film quality under commercially viable, including pressures above 200 mTorr. Thus, in a particularly preferred embodiment, after formation of the relaxed SiGe buffer layer 115, as described above, the substrate can again be cooled, surface active compound (preferably a Si or Ge precursor) is provided during at least part of the cool down (e.g., from 600-800° C. down to the Ge deposition temperature), and the strained Ge layer is deposited at the lower temperature.

Furthermore, Lee et al. found difficulties keeping their strained Ge films (which must be kept extremely thin to avoid relaxation) smooth during subsequent high temperature processing. Lee et al. accordingly deposited their strained Si layer over the Ge layer at very low temperatures, such that a 3 nm Si layer took 1.5 hours to deposit. As a solution to this issue, in accordance with a preferred embodiment, after deposition of a strained Ge layer and prior to further processing at temperature that would cause agglomeration of the Ge film, a Si cap layer is formed in situ over the Ge film at low temperatures. Preferably trisilane is employed as the Si precursor for this deposition, such that commercially reasonable deposition speeds can be obtained even at low temperatures. Preferably the substrate temperature is kept between about 325° C. and 475° C. during the Si deposition, more preferably between about 400° C. and 450° C. Despite the low temperatures, using trisilane at pressures in the preferred range of 1 Torr to 100 Torr with trisilane mass flow rates of about 5 mg/min to 50 mg/min can deposit Si at rates of 5 Å/min to 50 Å/min. Advantageously, if deposited with high quality crystallinity, the Si cap layer can be used as the strained epitaxial Si layer of a dual channel device, and will serve as protection against Ge agglomeration during subsequent processing at higher temperatures whether the Si is epitaxial, amorphous or polycrystalline. For example, after a sufficiently thick Si cap layer has been formed, temperatures can be increased to about 400° C. to 525° C. to increase deposition speed.

In summary, methods described herein can be employed to produce high quality epitaxial semiconductor films using the preferred process flow set forth in bullet point below. It will be understood that variations to or omissions from the list below can be made while still obtaining benefits of the process. It will be understood that the entire sequence can be conducted in situ within a single deposition chamber, such as an Epsilon® 3000 reactor from ASM America, Inc.

- high temperature processing (e.g., hydrogen baking or Si/SiGe deposition)
- cooling while bleeding surface active compound to the substrate (e.g., DCS)
- epitaxially deposit relaxed Ge layer at lower temperatures
- epitaxially deposit relaxed SiGe, retrograded from Ge to SiGe with 50% Ge content
- optionally in situ anneal to drive out defects and smooth compositional grading
- cooling while bleeding surface active compound to the substrate (e.g., DCS)
- epitaxially deposit strained Ge layer at lower temperatures
- deposit Si cap layer using trisilane (could serve as strained epi-Si of dual channel device)

The optional anneal can be a spike anneal. For example, in the Epsilon® reactors, temperature can be ramped as quickly as 200°/sec until a peak temperature of 950-1150° C. is reached. Even without any plateau annealing, such a spike anneal can be sufficient to drive out defects, particularly given the high Ge content at the lower interface. If the buffer layer is thin and sharply graded (e.g., 50 nm), even such a rapid anneal will diffuse Ge out of the lower seed layer into the overlying SiGe alloy and generally flatten the Ge profile. A thicker buffer layer (e.g., 500 nm) will maintain the Ge seed layer and distinctive retrograde profile after such rapid annealing.

The methods described herein also have particular benefit for depositing Si and Ge in a batch furnace. Batch furnaces typically have an elongated process chamber that is generally in the shape of a tube and is surrounded by heating elements. Typically, semiconductor wafers are loaded into the furnace with the wafer faces oriented perpendicular to the elongate axis of the tube. Inside the furnace, the wafers are spaced apart, with limited spacing between the wafers to allow for gas diffusion between and contact with the wafers. Typically, process gases are supplied to the interior of the furnace from one end of the furnace. In some arrangements, the gases flow in a direction parallel to the elongate axis and are exhausted from a furnace end opposite to the end from which they entered. Process gases enter the space between adjacent wafers by diffusion. In this way, a large number of wafers (typically 50-100 wafers) can be processed simultaneously, making processing using these batch furnaces an efficient and economical production method. Suitable batch furnaces are commercially available, and preferred models include the Advance® 400 and Advance® 412 Series batch furnaces commercially available from ASM International N.V. of Bilthoven, the Netherlands.

The batch furnace is preferably equipped with a localized gas injector configured to inject precursor gases into the batch furnace chamber at various locations where wafers are positioned. Batch furnaces equipped with localized gas injectors are commercially available, and preferred models include the Advance® 400 and Advance® 412 Series batch furnaces. A preferred batch furnace is equipped with vessels containing a silicon precursor, a surface active compound that can be different from the silicon precursor, and a germanium precursor. A preferred batch furnace further comprises at least one localized gas injector.

Figure 3:
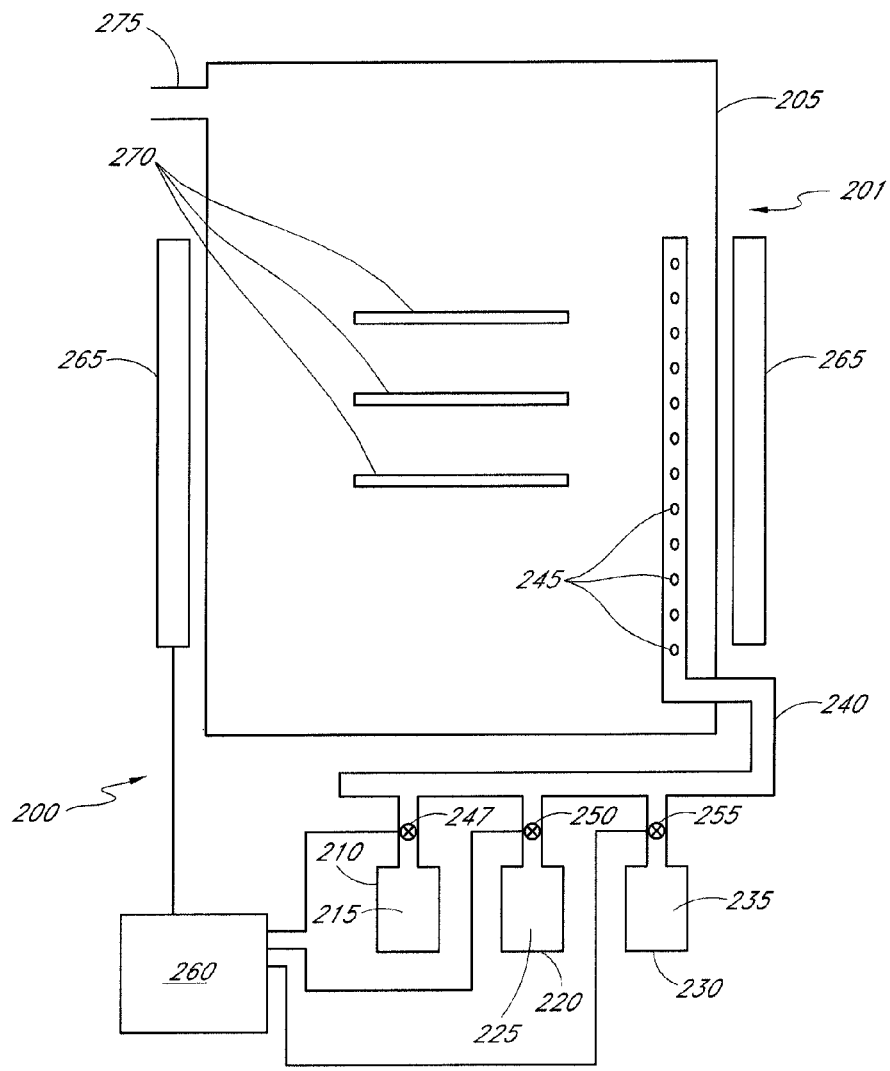
FIG. 3 shows a schematic cross sectional view of a batch deposition system in accordance with another embodiment of the present invention.

FIG. 3 schematically illustrates a preferred Si and Ge deposition system 200 comprising a batch furnace 201 having a chamber 205, a first reactant source or vessel 210 containing a silicon precursor 215, a second reactant source or vessel 220 containing a surface active compound 225, and a third reactant source or vessel 230 containing a germanium precursor 235. In the illustrated embodiment, the silicon precursor 215 is silane, the surface active compound 225 is trichlorosilane (TCS), and the germanium precursor 235 is germane, but those skilled in the art will understand that various silicon precursors, surface active compounds, and germanium precursors may be used as described elsewhere herein. The surface active compound can also double as the silicon precursor or germanium precursor in other arrangements.

In the illustrated embodiment, the batch furnace 201 is also equipped with an injector tube 240 operatively connected to the first, second and third vessels 210, 220, 230 to allow passage of the silicon precursor 215, the surface active compound 225, and the germanium precursor 235 to the interior of the chamber 205 via localized gas injectors 245, which are essentially small orifices in the injector tube 240. The density of injector orifices 245 per unit length can increase with distance from the feed end, as disclosed in U.S. Patent Publication No. 2003/0111013 A1, published Jun. 19, 2003, the disclosure of which is incorporated herein by reference. In this embodiment, the single injector tube 240 is used to supply the silicon precursor 215, the surface active compound 225, and the germanium precursor 235 to the interior of the chamber 205. In alternative embodiments (not shown in FIG. 3), two or more injector tubes are used, e.g., separate injector tubes are operatively connected to each of the first, second and third vessels 210, 220, 230. Additional vessels (not shown) containing, e.g., carrier gases, dopant precursor gases, etc., may also be operatively connected to the injector tube(s) 240 in a similar fashion. The first, second and third vessels 210, 220, 230 may be tanks containing the respective pressurized or unpressurized sources, and may comprise a bubbler and/or heater to facilitate delivery of the sources that are liquid under standard conditions in a vapor or gaseous form.

For the embodiment illustrated in FIG. 3, first, second, and third valves 247, 250, 255 are used to control the passage of the silicon precursor 215, the surface active compound 225 and the germanium precursor 235, respectively, from the respective first, second and third vessels 210, 220, 230 into the injector tube(s) 240. The valves 247, 250, 255 may be controlled manually, but are preferably controlled by a computer 260. The batch furnace 201 is also equipped with a heater 265 configured to heat the interior of chamber 205. The heater 265 is shown schematically as structure surrounding the chamber 205 FIG. 3, but it will be understood that various types of heaters known to those skilled in the art may be used, and may be located inside or outside the chamber 205. The heater is also preferably controlled by the computer 260 as illustrated in FIG. 3. The computer 260 is preferably preprogrammed to conduct a sequence of steps as described herein, including bleeding the surface active compound 225 into the chamber during a cool down step prior to Ge-containing deposition. For purposes of illustration, three wafers 270 are shown in the interior of the batch furnace 201, but it is understood that the batch furnace 201 may contain larger or smaller numbers of wafers (typically 50-100 wafers). Excess gases and byproduct are removed via vacuum pump (not shown) through an exhaust 275.

Figure 4:
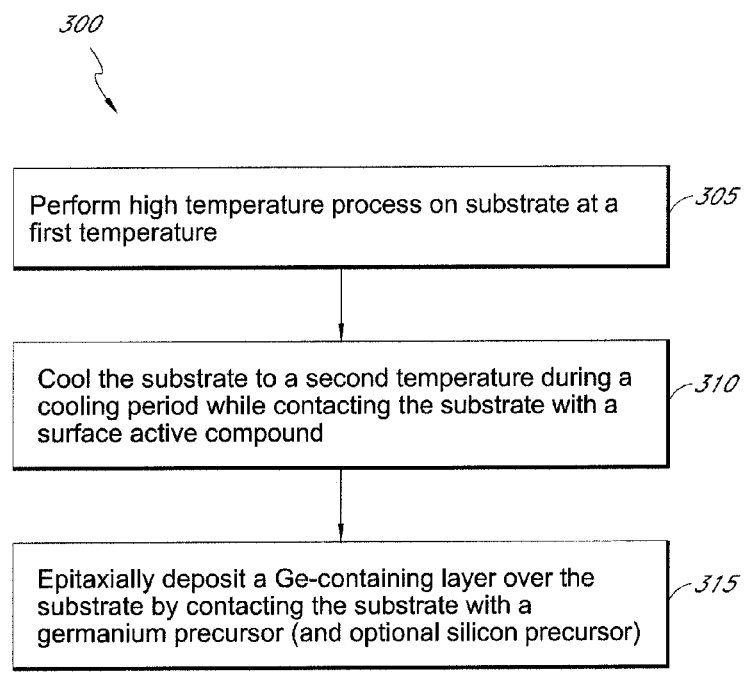
FIG. 4 shows a flowchart for a preferred deposition process.

With reference to FIG. 4, a deposition sequence 300 may be conducted in the general manner described above, by high temperature processing 305 (e.g., hydrogen bake or using the silicon precursor to deposit a Si-containing layer), supplying 310 the surface active compound to prevent contamination of the surface of the Si-containing layer during a cooling period, and supplying 315 the germanium precursor to deposit the Ge-containing layer. The process 300 will be described in more detail with respect to a particular embodiment below, using an example in which the high temperature processing includes a Si deposition step and the sequence 300 is performed in the batch reactor of FIG. 3. It will be understood that the sequence 300 can also be conducted in a single wafer reactor, such as that of FIG. 1.

In the first step 305, after a hydrogen bake step to clean the silicon surface, the silicon precursor is used to deposit the Si-containing layer. In the illustrated embodiment, employing the system 200, the Si-containing layer is epitaxial silicon and is deposited onto the wafers 270 by first heating the substrates 270 to a first deposition temperature of about 600° C., then opening the first valve 247 and allowing the silicon precursor 215 (in this example silane) to flow from the first vessel 210 into the interior of the chamber 205 via the injector tube 240 and the localized gas injectors 245. After the desired thickness of epitaxial silicon has been deposited, the first valve 247 is closed and the first stage of the deposition is terminated. In an alternative embodiment (not illustrated), the Si-containing layer is formed outside the deposition system 200, e.g., the wafers 270 already comprise a single crystal Si surface layer when they are placed into the chamber 205. In this alternative embodiment, the first high temperature step 305 comprises only the bake step that is used to clean the single crystal Si surface.

In the second step 310, the single crystal Si left by the first step (e.g., deposited epitaxial Si layer or the single crystal substrate cleaned by baking) is cooled to a second temperature of about 400° C., while concurrently contacting the single crystal Si structure with the surface active compound 225 (in this case trichlorosilane). Cooling is accomplished by controlling the output of the heater 265. The contacting of the epitaxial Si substrate with the trichlorosilane is accomplished by opening the second valve 250 and allowing the trichlorosilane to flow from the second vessel 220 into the interior of the chamber 205 via the injector tube 240 and the localized gas injectors 245. In an alternative embodiment, the flow of the trichlorosilane is initiated before cooling begins, e.g., near the end of the first step 305.

In the third step 315, a Ge-containing material is deposited onto the single crystal Si by contacting the epitaxial Si layer with the germanium precursor 225 (in this example germane). The contacting of the single crystal Si structure with the germane is accomplished by opening the third valve 255 and allowing the germane to flow from the third vessel 230 into the interior of the chamber 205 via the injector tube 240 and the localized gas injectors 245. In one embodiment, the Ge-containing material is SiGe, and is deposited by concurrently contacting the single crystal Si structure with the germane and the silicon precursor 215 (in this example silane), by concurrently opening the first valve 245 and allowing the silane to flow from the first vessel 210 into the interior of the chamber 205 via the injector tube 240 and the localized gas injectors 245. In an alternative embodiment (not shown), the multi-layer film 100 is deposited by first depositing the epitaxial Si layer 105 according to the first step 305, then contacting with trichlorosilane and cooling according to the second step 310. Depositing the thin epitaxial Ge-containing layer 110 and the $Si_{1-x}Ge_x$ layer 115 according to the third step 315 is then carried out in this alternative embodiment by first allowing only the germane to flow from the third vessel 230 into the interior of the chamber 205 via the injector tube 240 and the localized gas injectors 245 for a time sufficient to form the thin epitaxial Ge layer 110 (FIG. 2), then allowing both the germane and the silane to flow for a time sufficient to form the $Si_{1-x}Ge_x$ layer 115 (FIG. 2).

Batch furnaces typically contain multiple wafers and thus are often larger than single wafer reactors. They typically cool down more slowly than single wafer reactors and may suffer greater levels of contamination, partly due to the length of time during cool down. Thus, use of a surface active compound gas during cooling as described above may be particularly advantageous in a batch furnace in order to reduce or eliminate undesirable contamination of the epitaxial silicon substrate.

Figure 5:
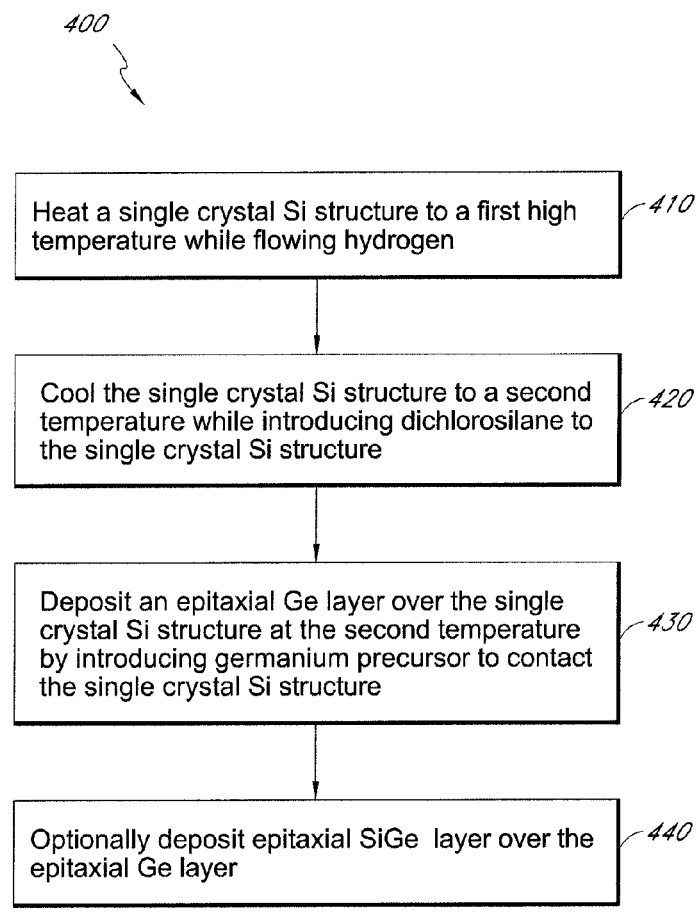
FIG. 5 shows a flowchart for a more particular preferred epitaxial Ge deposition process.

FIG. 5 illustrates an embodiment for depositing an epitaxial Ge film (doped or undoped) onto a single crystal silicon structure (doped or undoped) in accordance with the methods described herein. Deposition may be carried out in a batch furnace by the process described above. The embodiment of FIG. 5, however, is described and has been demonstrated by the inventors for germanium deposition in a single wafer processing tool. In the past, germanium films deposited onto single crystal silicon substrates at higher pressures typical of single wafer tools, in the range of about 200 mTorr to about 760 Torr, had a relatively high level of defects, e.g., high threading dislocation density. The defects were believed to result from contamination of the single crystal silicon surface during cool down after high temperature deposition or cleaning, possibly due to imperfect sealing of the chamber. It was found that the contamination could be mitigated somewhat by shortening the cool down and depositing the germanium at a higher temperature, but germanium deposition at such higher temperatures typically produced rougher surfaces. Contamination could also be mitigated by conducting the cool down and subsequent germanium deposition at extremely low pressures, but deposition rates at such low pressures were slower than desired and often impractical for most single wafer tool designs.

It has now been discovered that high quality epitaxial germanium films may be deposited onto single crystal silicon substrates at pressures in the range of about 200 mTorr to about 760 Torr by contacting the single crystal Si substrate with a surface active compound during at least a portion of the cooling time period. Germanium films deposited in accordance with this embodiment preferably have a threading dislocation density of about $10^7$ defects/cm$^2$ or less, more preferably about $10^5$ defects/cm$^2$ or less, and/or a preferred surface roughness of about 25 Å or less, more preferably about 20 Å or less, as measured by atomic force microscopy. The defect densities and roughness measurements described herein obtain across at least a 10 micron×10 micron window. Germanium deposition at pressures in the range of about 1 Torr to about 760 Torr preferably permits deposition rates of about 250 Å per minute or higher, more preferably about 400 Å per minute or higher. In contrast, germanium deposition rates at very low pressures are typically about 100 Å per minute or less.

Epitaxial germanium deposition at pressures in the range of about 0.001 Torr to about 760 Torr is preferably conducted in a single-wafer, horizontal gas flow reactor, preferably radiatively heated. Suitable reactors of this type are commercially available, and preferred models include the Epsilon® series of single wafer epitaxial reactors commercially available from ASM America, Inc. of Phoenix, Ariz., as described above with respect to FIG. 1.

FIG. 5 illustrates a more particular embodiment, relative to the general sequence of FIG. 4, in which the sequence 400 includes a $H_2$ bake 410, cool down with surface active compound 420, "pure" Ge deposition 430 and optional further SiGe alloy deposition 440 thereover. In the first step 410 of the illustrated embodiment, a single crystal silicon substrate is heated in a single wafer reactor to a first temperature effective for desorption of any hydrogen termination of the silicon and removal of contaminants, e.g., about 900° C. As discussed above, in other arrangements, the single crystal Si surface provided at the first temperature may result from deposition conducted at or near the first temperature. The first temperature may be 450° C. or greater, or 650° C. or greater, as desired, in order to accomplish the desired deposition or cleaning. In the illustrated embodiment, during step 410 a single crystal Si substrate is placed into the single wafer reactor and heated to about 900° C. for two minutes under flowing ultrapure hydrogen at a pressure of 10 Torr to remove surface contaminants, such as carbon and native oxide.

In the next step 420, the single crystal Si substrate is cooled to a second temperature during a cooling time period. In the illustrated embodiment, the single crystal Si substrate is cooled from the bake temperature to the germanium deposition temperature, which tends to be lower due to the tendency of the most common precursor, germane, to decompose at higher temperatures prior to reaching the substrate, and due to the tendency of germanium to migrate and agglomerate on oxide, leading to a high degree of surface roughness. In experiments, the substrate was cooled from a bake temperature of about 900° C. to about 350° C. at a cooling rate of about 4° C. per second, while maintaining the reactor pressure at about 10 Torr. Those skilled in the art will understand from the disclosure herein that the pressure within the reactor during the cooling time period can generally be in the range of about 0.001 Torr to about 760 Torr, but is more preferably about 1 Torr to about 100 Torr, and that the cooling rate is preferably in the range of about 1° C. per second to about 10° C. per second.

During at least part of the cooling step 420, the single crystal Si substrate is contacted with a surface active compound. Depending on the cooling conditions, preferred surface active compounds for this purpose include silanes (e.g., silane, disilane, and trisilane), halosilanes (e.g., chlorosilane, dichlorosilane, trichlorosilane, and tetrachlorosilane), alkylsilanes (e.g., methylsilane, dimethylsilane, trimethylsilane and tetramethylsilane), germanes (e.g., germane and digermane) and halogermanes (e.g., chlorogermane, dichlorogermane, trichlorogermane, and tetrachlorgermane). In the illustrated embodiment, the surface active compound is dichlorosilane (DCS) that was introduced in experiments to the reactor at a flow rate of about 10 standard cubic centimeters per minute (sccm) from a tank connected to the reactor by a feed line and appropriate valves. The contact between the surface active compound and the single crystal Si substrate may be initiated at the same time that cooling is initiated, before cooling is initiated, or after cooling is initiated. In the illustrated embodiment, the dichlorosilane is introduced into the single wafer reactor and contacted with the single crystal Si substrate at step 420 at about the same time that cooling begins.

Thus, in the illustrated embodiment, the dichlorosilane is contacted with the single crystal surface during the entire cooling period, resulting in the deposition of about 500 Å of epitaxial silicon on the single crystal silicon surface during the cooling period. Preferably, such deposition is minimized so that the thickness of the material deposited during cooling is about 500 Å or less, more preferably about 200 Å or less. It has been found that smaller amounts of silicon are deposited during an exemplary cooling step 420 from 900° C. to 350° C. when the dichlorosilane is contacted with the single crystal silicon during only a portion of the cooling period, e.g., from about an intermediate temperature of 700° C. to about 350° C. Preferably, contact between the single crystal silicon and the dichlorosilane begins during cooling at an intermediate temperature of about 600° C.-800° C., more preferably 650° C. or higher, to avoid contamination during the lower temperature period from the intermediate temperature down to the Ge deposition temperature, in which cooling tends to be slower and desorption/reduction of contaminants tends to be less effective.

For a single wafer reactor, a silicon precursor (e.g., dichlorosilane or DCS) is preferably employed with a flow rate between about 1 sccm and 50 sccm, while a batch reactor can employ dichlorosilane or more preferably trichlorosilane (TCS) of with a flow rate between about 1 sccm and 500 sccm at a lower pressure. While Ge precursors can also be used, silicon compounds are preferred because deposition during cooling will be minimized and any deposited silicon will have a reduced tendency to agglomeration during the cooling.

In the next step 430, an epitaxial Ge layer is deposited over the single crystal silicon substrate at a second temperature by introducing a germanium source to the single wafer reactor. In the illustrated embodiment, the epitaxial germanium layer is deposited at a second temperature of about 350° C., a deposition rate of about 20-100 Å per minute, and a pressure of about 10 Torr, by introducing germane to the single wafer reactor at a flow rate of about 20 sccm. Those skilled in the art will understand that other germanium sources (e.g., digermane, trigermane, chlorinated germanium sources) may be used in place of germane, with appropriate adjustment of flow rate, deposition temperature and pressure as discussed above.

Deposition may be continued at this temperature, or, preferably, the deposition temperature may then be increased in order to increase the deposition rate and decrease defect density as-deposited. For example, during a first stage of step 430, germane may be introduced to the chamber at 350° C. for about 2 minutes to produce an initial smooth continuous layer of epitaxial germanium having a thickness of about 600 Å. The initial epitaxial germanium layer is then preferably heated to about 650° C. during a second stage of step 430 and the germane flow continued to deposit an additional 9,400 Å of epitaxial germanium at a deposition rate of about 500-700 Å per minute, onto the initial germanium layer. The resulting epitaxial germanium film forms in this two-stage process in about 21 minutes. Overall, the epitaxial Ge layer is preferably deposited at a rate of at least about 300 Å per minute, more preferably at least about 500 Å per minute. Layers deposited by the method described above exhibited a threading dislocation density of about $10^7$ defects/cm$^2$, and a surface roughness of about 13 Å rms, as measured by atomic force microscopy on a 10 micron by 10 micron window. To obtain desirable smoothness, e.g., about 25 Å rms or less, more preferably about 20 Å rms or less, it is preferred that deposition of the germanium begin at a temperature in the range of about 300° C. to about 400° C. and continue until a smooth continuous layer of germanium has been deposited.

Figure 6:
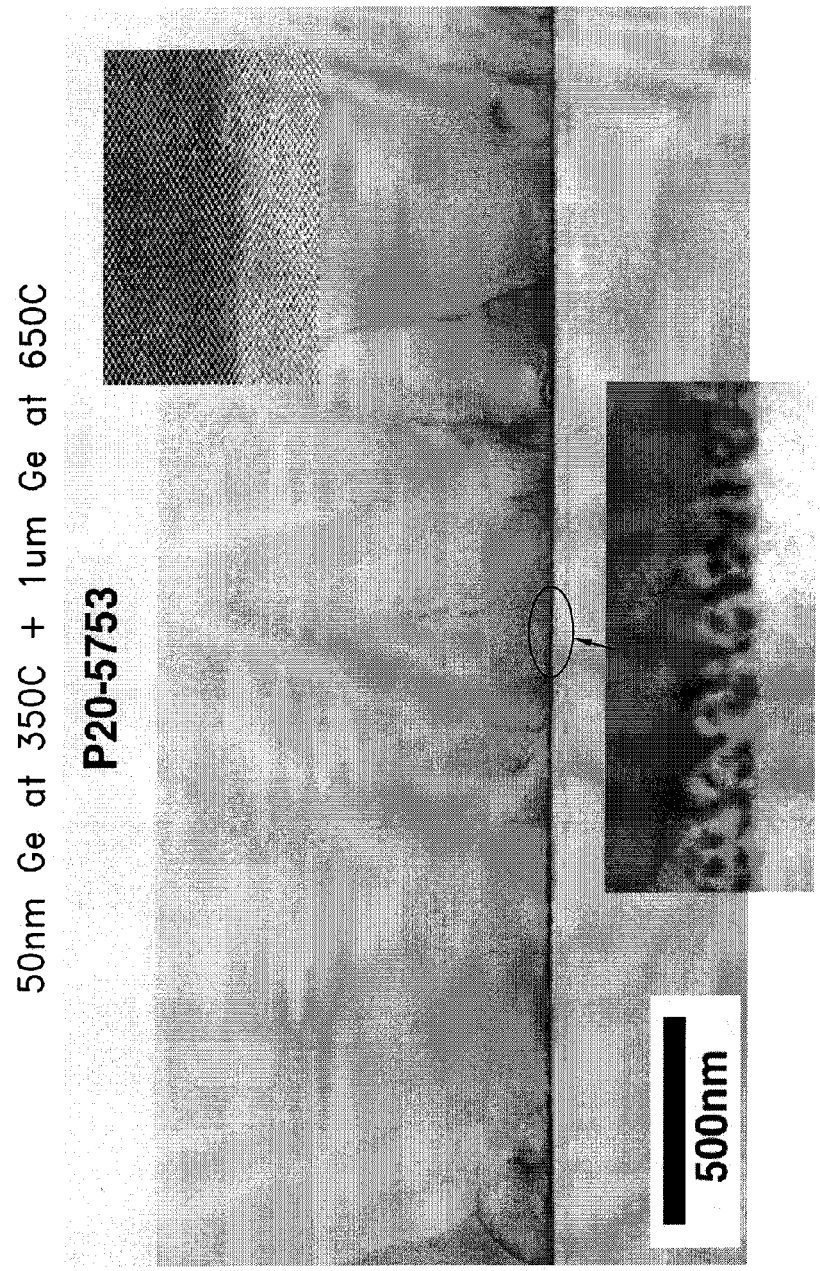
FIG. 6 is a transmission electromicrograph (TEM) of a low temperature, smooth 50 nm germanium seed layer within an overlying high temperature 1 μm germanium bulk film formed by the methods described herein.
Figure 7:
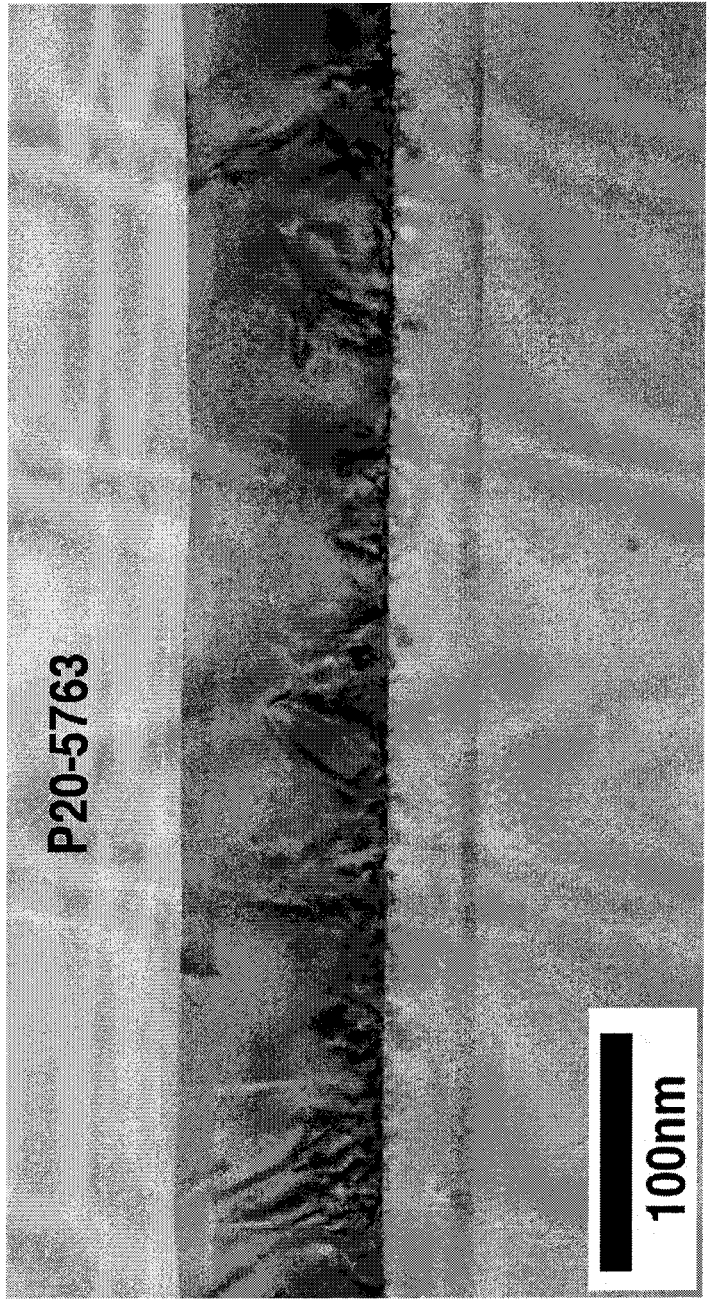
FIG. 7 is a TEM of a 75-nm germanium seed layer formed by the methods described herein.
Figure 8:
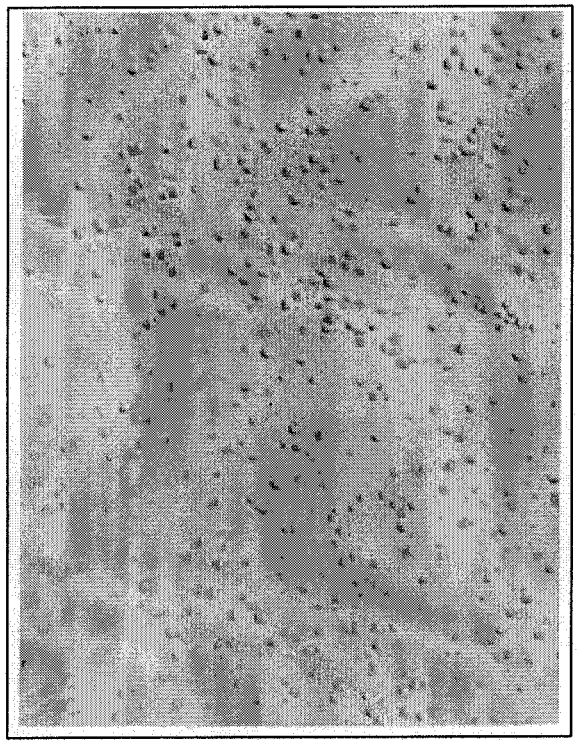
FIG. 8 is a surface scan of an etch pit decorated (EPD) germanium film deposited in accordance with a preferred embodiment, illustrating about $10^7$ defects/cm$^2$. The film was etched by using 35 mL AcOH, 10 mL HNO$_3$, 5 mL HF and 8 mg I$_2$, and shown in 1000× magnification of a surface 108×82 μm$^2$.
Figure 9:
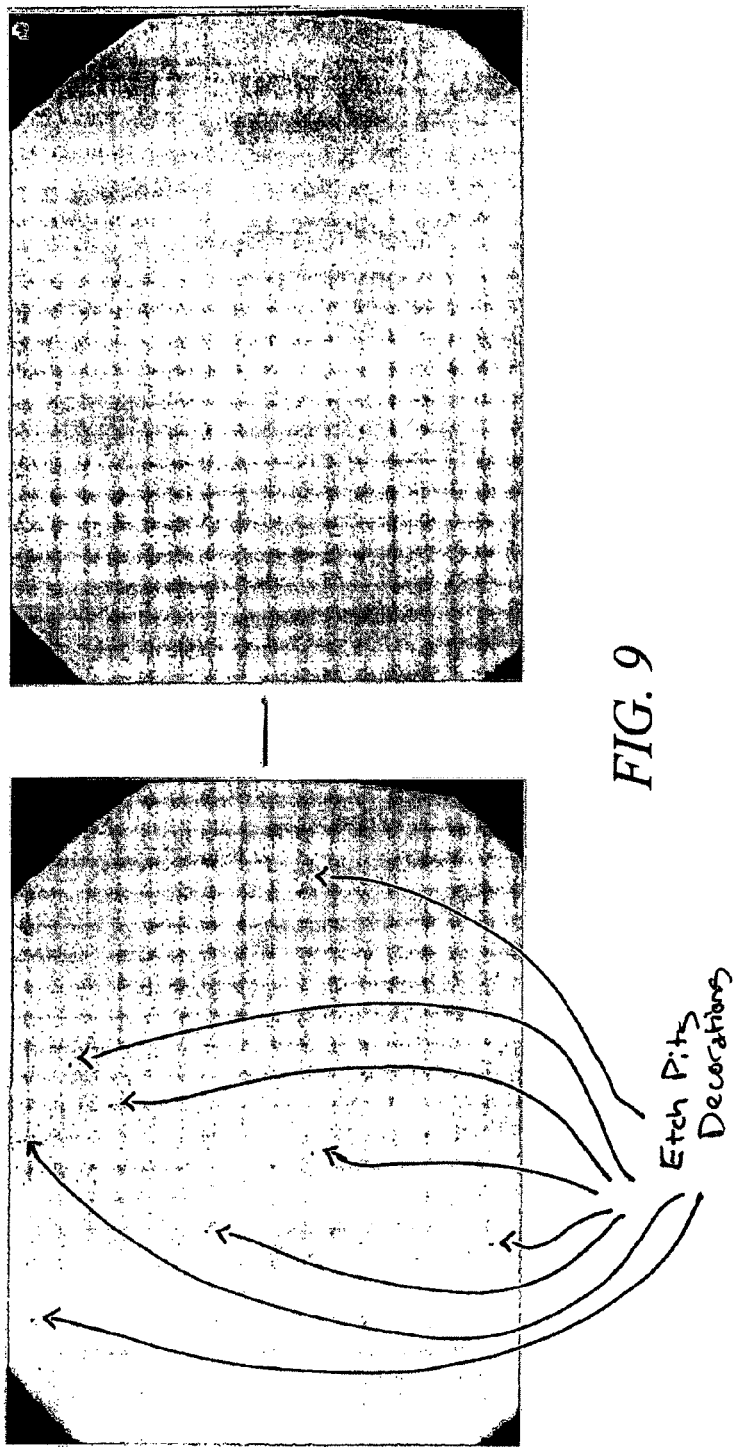
FIGS. 9-13 are surface scans of EPD germanium films deposited in accordance with the preferred embodiments having various levels and types of doping, illustrating less than $10^3$ defects/cm$^2$.
Figure 10:
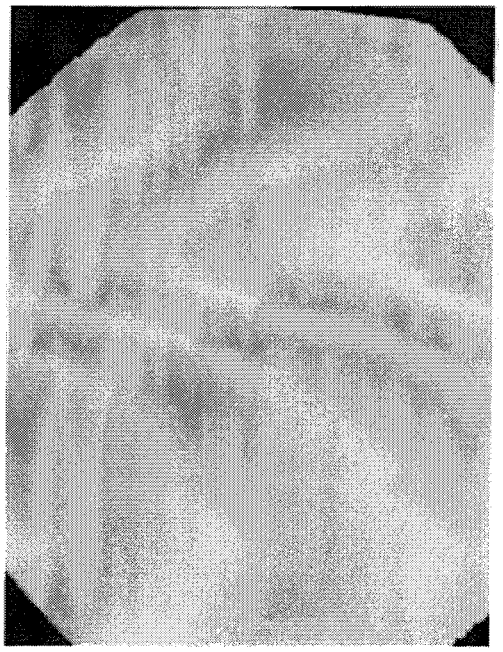
Figure 10:
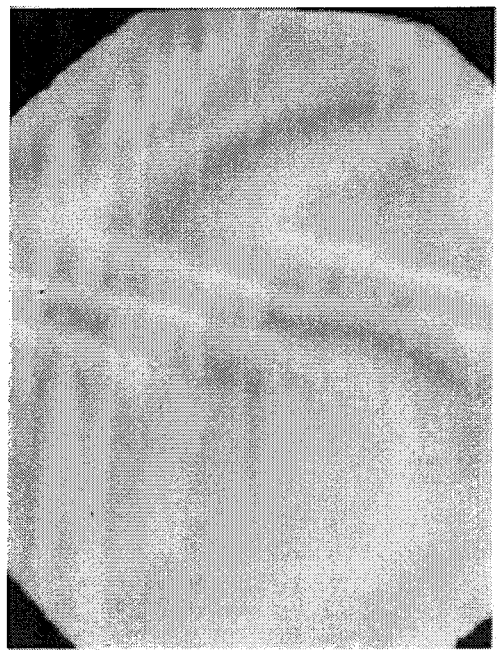
Figure 11:
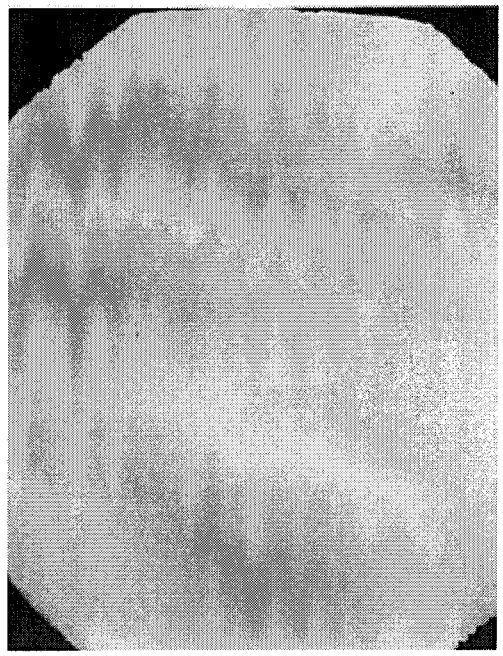
Figure 11:
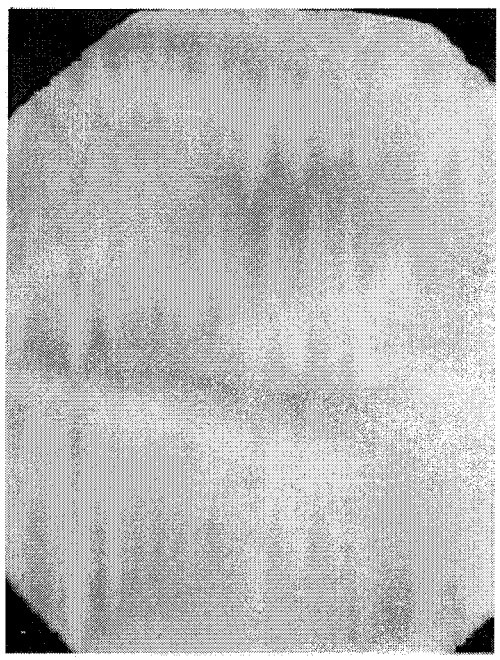
Figure 12:
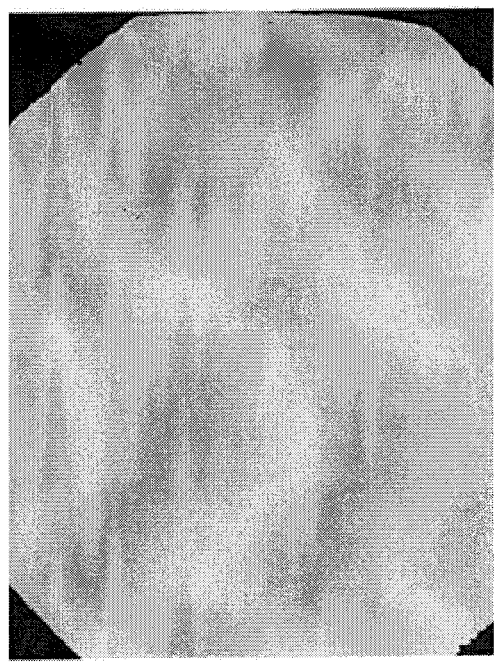
Figure 12:
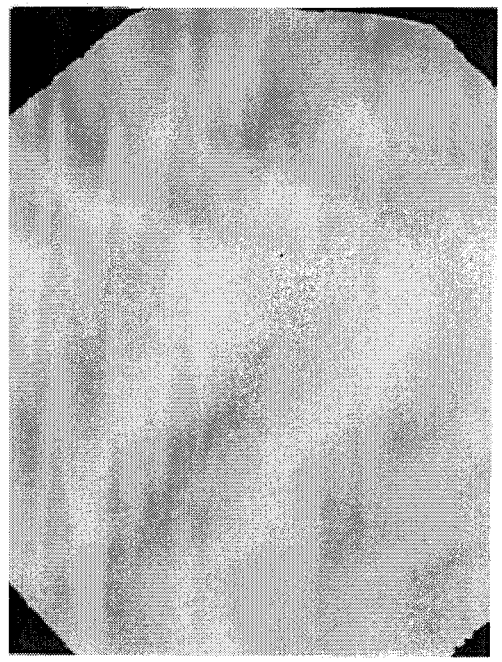
Figure 13:
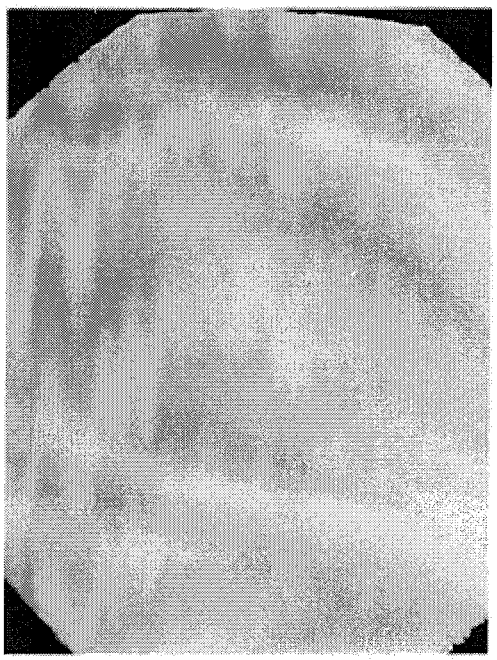
Figure 13:
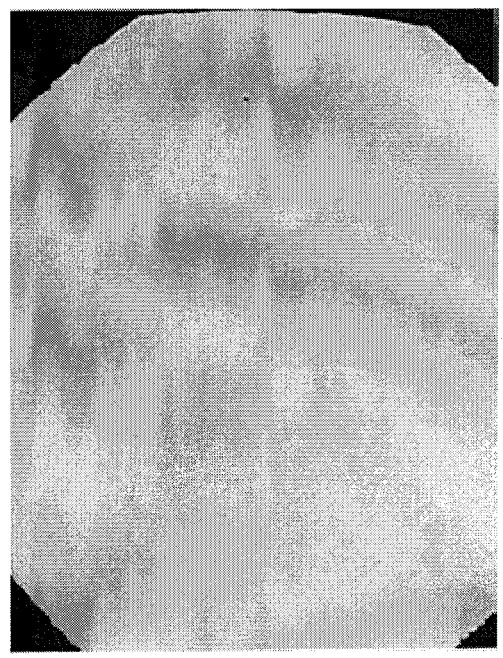

FIGS. 6-8 illustrate actual films deposited by the methods described above, where FIG. 6 shows the Ge seed and bulk layers of the above-described two-stage deposition, FIG. 7 shows another Ge seed layer deposited with excellent uniformity at low temperature, and FIG. 8 illustrates the low defect densities produced by Ge deposition in accordance with the preferred embodiments.

Pure germanium deposition has been demonstrated in the Epsilon® reactor with even better results than those noted above. With deposition rates in the range of 700-900 Å/min, resultant Ge films exhibited surface roughness of 2.8 Å rms and defect densities, as measured by etch pit decoration (EPD) of $10^3$ defects/cm$^2$. Particular process conditions used to obtain these results include the general process sequences taught herein, including provision of a surface active compound during cool down. In addition, the process conditions included use of a three-step germanium deposition, in which a Ge seed layer was deposited at low temperature (e.g., 350° C. for germane), followed by temperature ramping to a higher temperature (e.g., approximately 600-800° C.) while continuing to flow germane, and continued deposition at the higher temperature. Additionally, hydrogen gas was supplied to the reactor at high flow rates (e.g., about 5 slm or greater) with pressures in the range of 10-100 Torr. Further details on the actual process conditions are disclosed in U.S. provisional patent application No. 60/548,269, filed Feb. 27, 2004, entitled GERMANIUM DEPOSITION, the disclosure of which is incorporated herein by reference.

Figure 14:
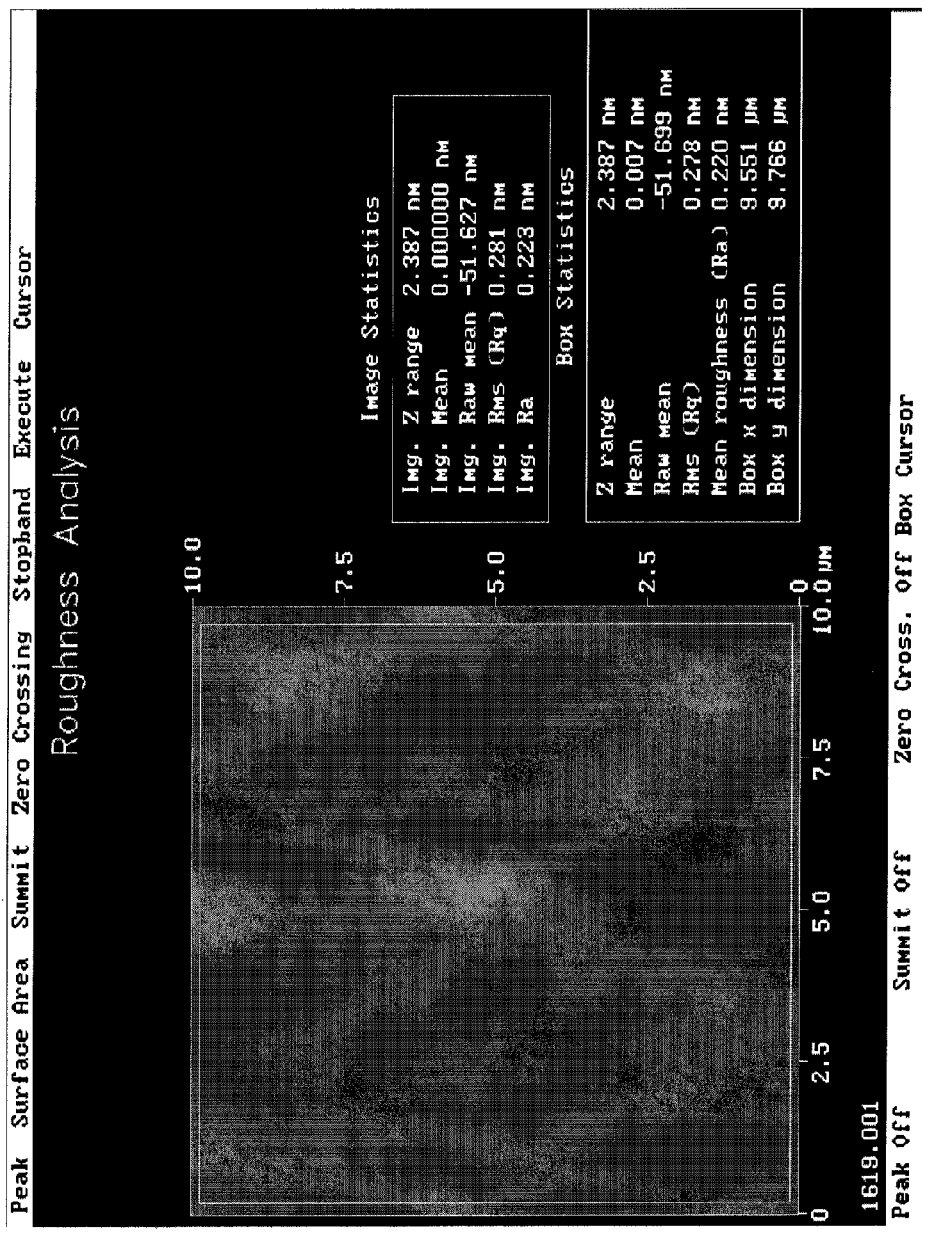
FIG. 14 is a surface roughness analysis of a germanium film deposited in accordance with the preferred embodiments, illustrating about 2.8 Å rms surface roughness.

FIGS. 9-14 illustrate results from the above-described process. In each deposition, process conditions in an Epsilon® chamber included provision of 17 sccm DCS bled into the chamber during a prior cool down; low temperature Ge seed deposition, temperature ramping with continued deposition, and higher temperature bulk Ge deposition; 30 slm $H_2$; 200 sccm of GeH$_4$ (10% in $H_2$); and a chamber pressure of 20 Torr. Using these conditions, As, P, and intrinsic films were developed. The scans with "100×" magnification represent a wafer surface 0.93×1.23 mm; scans with "200×" magnification represent 0.46×0.63 mm; and FIG. 8 ("1000×") represents 0.093×0.123 mm. By counting the black spots on the surfaces, representing defects that are "decorated" or stand out due to the etch process (conditions noted on FIG. 8), a defect density in EPD/cm$^2$, can be calculated. All of FIGS. 9-13 show densities on the order of $10^3$ EPD/cm$^2$ or lower, and many trials showed less than $10^2$ EPD/cm$^2$. FIG. 14 also illustrates a surface roughness measured at 2.8 Å rms. Several wafers deposited in accordance with the methods described herein, at various in situ doping levels, demonstrated better than 3 Å rms surface roughness.

Thus the methods provide a multilayer structure comprising an underlying single crystal silicon layer and an overlying epitaxial germanium layer having a threading dislocation density of about $10^7$ defects/cm$^2$ or less, more preferably about $10^5$ defects/cm$^2$ or less, and most preferably about $10^3$ defects/cm$^2$ or less; and a surface roughness of about 20 Å rms or less, more preferably about 10 Å rms or less, and most preferably about 3 Å rms or less, as measured by atomic force microscopy; these values preferably hold true across at least a 10 micron×10 micron window. Such multilayer structures are preferably made by the processes described herein. Preferably, the overlying epitaxial germanium layer has a thickness in the range of about 500 Å to about 2 microns. Preferably, the underlying single crystal silicon structure is a wafer.

Following epitaxial Ge deposition, an epitaxial SiGe alloy can optionally be deposited 440 thereover, as described above with respect to FIG. 2. As noted above, the SiGe alloy, together with the deposited epitaxial Ge layer, preferably provides a relaxed buffer for subsequent strained Si deposition. Moreover, the SiGe alloy can be "retrograded" from the pure Ge layer with increasing Si concentration as deposition proceeds until a suitable SiGe composition is reached for the desired strain in the layer to be deposited.

For example, in a preferred embodiment, a commercially available single crystal silicon wafer substrate may be heated to a first temperature in a reactor to drive off contaminants, cooled to a second temperature during a cooling time period during at least part of which the cleaned silicon surface is contacted with a surface active agent, then an epitaxial germanium layer may be deposited on the single crystal surface at the second temperature. The resulting Ge/Si wafers, comprising an epitaxial Ge layer on an underlying Si wafer, have substantial utility as substrates for the manufacture of optoelectronic and microelectronic devices. Pure germanium wafers would be desirable substrates, but their manufacture thus far has been cost-prohibitive due to the relative scarcity of germanium as compared to silicon. However, a Ge/Si wafer having a high quality epitaxial germanium overlayer as described herein provides substantially the same utility as a germanium wafer at a significantly reduced cost. The thickness of the epitaxial germanium overlayer depends on the ultimate application, but is preferably in the range of about 500 Å to about 2 microns, more preferably about 1,000 Å to about 1 micron. As noted, the overlying epitaxial germanium layer preferably has a threading dislocation density of about $10^7$ defects/cm$^2$ or less, more preferably about $10^5$ defects/cm$^2$ or less, as measured by the etch pit decoration (EPD) method, and thus is suitable as a substrate for the manufacture of a wide variety of optoelectronic devices.

Those skilled in the art will understand that terms such as "silicon," "silicon-germanium," "Si," and "SiGe," are terms of art used to show that the material comprises the indicated elements, and are not to be construed as limiting the relative proportions of those elements nor as excluding the presence of other elements. Thus, for example, a "SiGe" film may contain Si and Ge in various proportions and may contain other elements as well, e.g., electrically active dopants such as antimony, boron, arsenic and phosphorous. Those skilled in the art will understand that single crystal Ge (e.g., epitaxial Ge) is highly pure (>99.9% Ge) and that single crystal Si (e.g., epitaxial Si) is also highly pure (>99.9% Si), and that both may be undoped or doped with electrically active dopants.

It will be appreciated by those skilled in the art that various omissions, additions and modifications may be made to the processes described above without departing from the scope of the invention, and all such modifications and changes are intended to fall within the scope of the invention, as defined by the appended claims.

We claim:

1. A method for forming a protective cap layer, the method comprising:
    providing a strained epitaxial film; and
    changing deposition conditions to provide a flow of a silicon precursor to the strained film to deposit a protective silicon cap layer having a silicon content of greater than 99.9% on the strained epitaxial film in situ at a deposition temperature between about 325° C. and about 475° C.

2. The method of claim 1, wherein depositing the protective cap layer takes place at a deposition rate of between about 5 Å/min and about 50 Å/min.

3. The method of claim 1, wherein the strained epitaxial film has a germanium content of about 99 atomic percent or higher.

4. The method of claim 1, wherein the silicon precursor comprises trisilane.

5. The method of claim 4, wherein providing a flow of the silicon precursor comprises flowing trisilane at a flow rate between about 5 mg/min to 50 mg/min.

6. The method of claim 1, wherein providing a flow of the silicon precursor comprises maintaining a deposition pressure between about 1 Torr and 100 Torr.

7. A method of preventing agglomeration of a strained germanium-containing layer deposited on a relaxed buffer layer, the method comprising:
    providing a structure having the strained germanium-containing layer deposited on the relaxed buffer layer;
    providing a flow of a silicon precursor to the strained layer to deposit an epitaxial layer at a temperature between about 325° C. and about 475° C. to serve as a cap layer that prevents agglomeration of the strained germanium-containing layer, wherein the cap layer has a silicon content of greater than 99.9%.

8. The method of claim 7, wherein depositing the epitaxial layer takes place at a deposition rate of between about 5 Å/min and about 50 Å/min.

9. The method of claim 7, wherein the strained layer contains less than 1% silicon.

10. The method of claim 7, wherein the relaxed buffer layer comprises SiGe.

11. The method of claim 7, wherein the strained layer comprises a Ge layer.

12. The method of claim 7, wherein the silicon precursor comprises trisilane.

13. The method of claim 7, wherein providing a flow of the silicon precursor occurs at a deposition pressure between about 1 Torr and 100 Torr.

14. The method of claim 7, further comprising increasing temperature to increase deposition speed after a sufficiently thick epitaxial layer is deposited at the deposition temperature between about 325° C. and about 475° C.

15. The method of claim 14, wherein increasing temperature comprises reaching an elevated temperature between about 400° C. and about 525° C.

* * * * *